US012529801B2

(12) United States Patent
Greiff et al.

(10) Patent No.: US 12,529,801 B2
(45) Date of Patent: Jan. 20, 2026

(54) SYSTEM AND METHOD FOR TRACKING STATE OF RECEIVER OF GLOBAL NAVIGATIONAL SATELLITE SYSTEM

(71) Applicant: Mitsubishi Electric Research Laboratories, Inc., Cambridge, MA (US)

(72) Inventors: Marcus Greiff, Cambridge, MA (US); Karl Berntorp, Cambridge, MA (US); Stefano Di Cairano, Cambridge, MA (US)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 333 days.

(21) Appl. No.: 18/215,976

(22) Filed: Jun. 29, 2023

(65) Prior Publication Data
US 2025/0004143 A1    Jan. 2, 2025

(51) Int. Cl.
*G01S 19/43* (2010.01)
*G01S 19/23* (2010.01)

(52) U.S. Cl.
CPC ............. *G01S 19/43* (2013.01); *G01S 19/23* (2013.01)

(58) Field of Classification Search
CPC ................................ G01S 19/43; G01S 19/23
USPC .................................................... 342/357.23
See application file for complete search history.

(56) References Cited

U.S. PATENT DOCUMENTS 9,261,597 B2    2/2016  Bar-Sever et al.
2023/0104403 A1*  4/2023  Erez ................... G01C 21/3848
                                                    701/409

FOREIGN PATENT DOCUMENTS

WO    WO-2024138110 A2 *  6/2024    ............ G01C 21/28

OTHER PUBLICATIONS

Backward smoothing for precise GNSS applications, Vaclavovic, Pavel and Dousa, Jan, Advances in Space Research, vol. 56, No. 8, pp. 1627-1634, 2015, Elsevier.
Low cost strapdown inertial/GPS integrated navigation for flight test requirements, Leach, Barrie W, Proc. of the 6 th Saint Petersburg International Conference on Integrated Navigation Systems, pp. 17-1, 1999.

* cited by examiner

Primary Examiner — Harry K Liu
(74) Attorney, Agent, or Firm — Gene Vinokur

(57) ABSTRACT

Provided is a system for tracking a state of a receiver. The system receives a set of measurements collected over a period of time, indicative of a motion of the receiver. The system further processes set of measurements relating to the receiver with a probabilistic smoother to estimate a state trajectory of the receiver for the period of time, the set of measurements is associated with a probabilistic estimation model. The probabilistic smoother iteratively implements a smoothing process followed by a feedback refining process for at least some parameters of the probabilistic estimation model until a termination condition is met. The smoothing process updates the state trajectory based on the at least some parameters. The feedback refining process updates the at least some parameters to improve a metric indicative of a measurement likelihood. The system further renders the estimated state trajectory and at least some estimated model parameters.

20 Claims, 25 Drawing Sheets

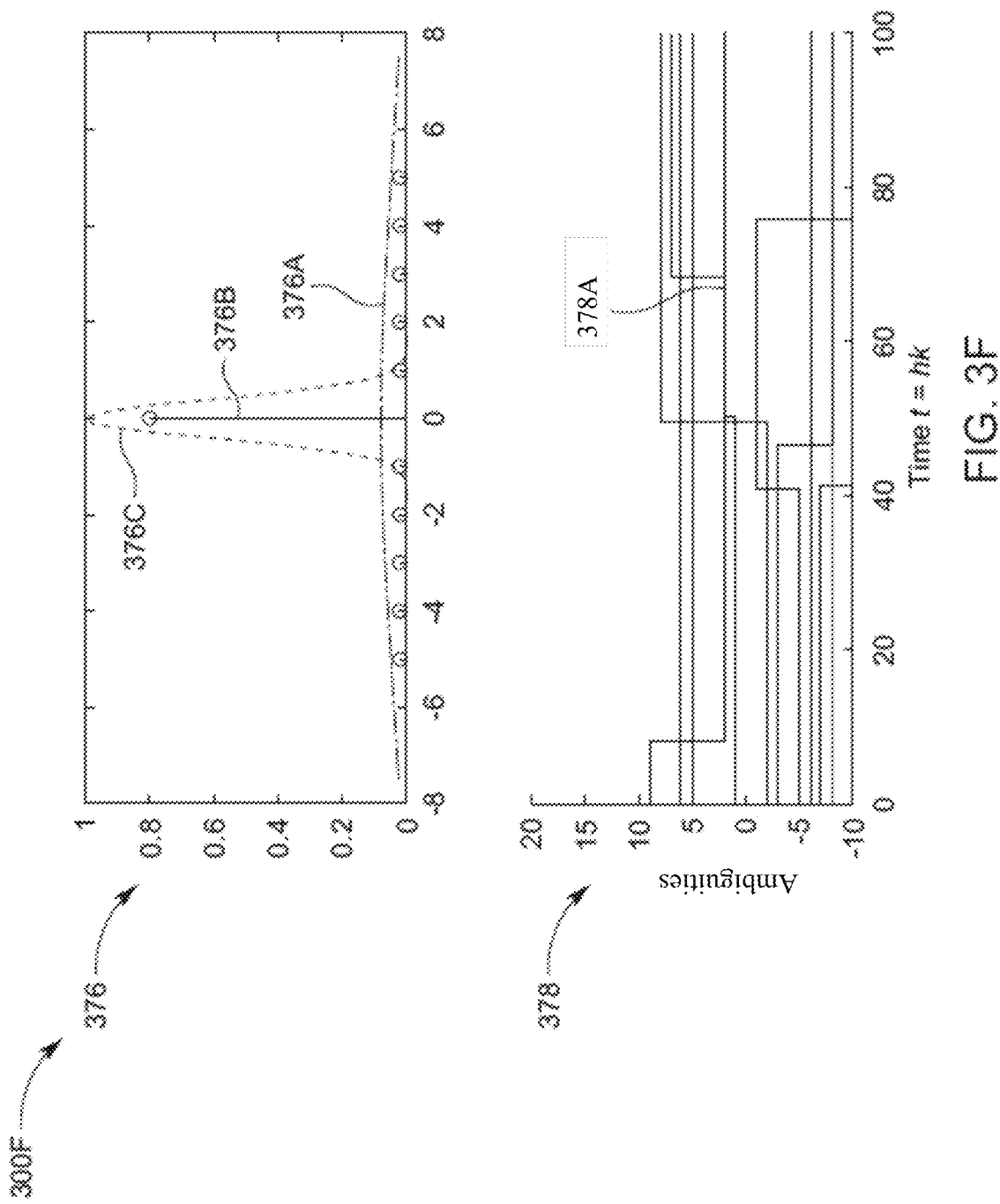

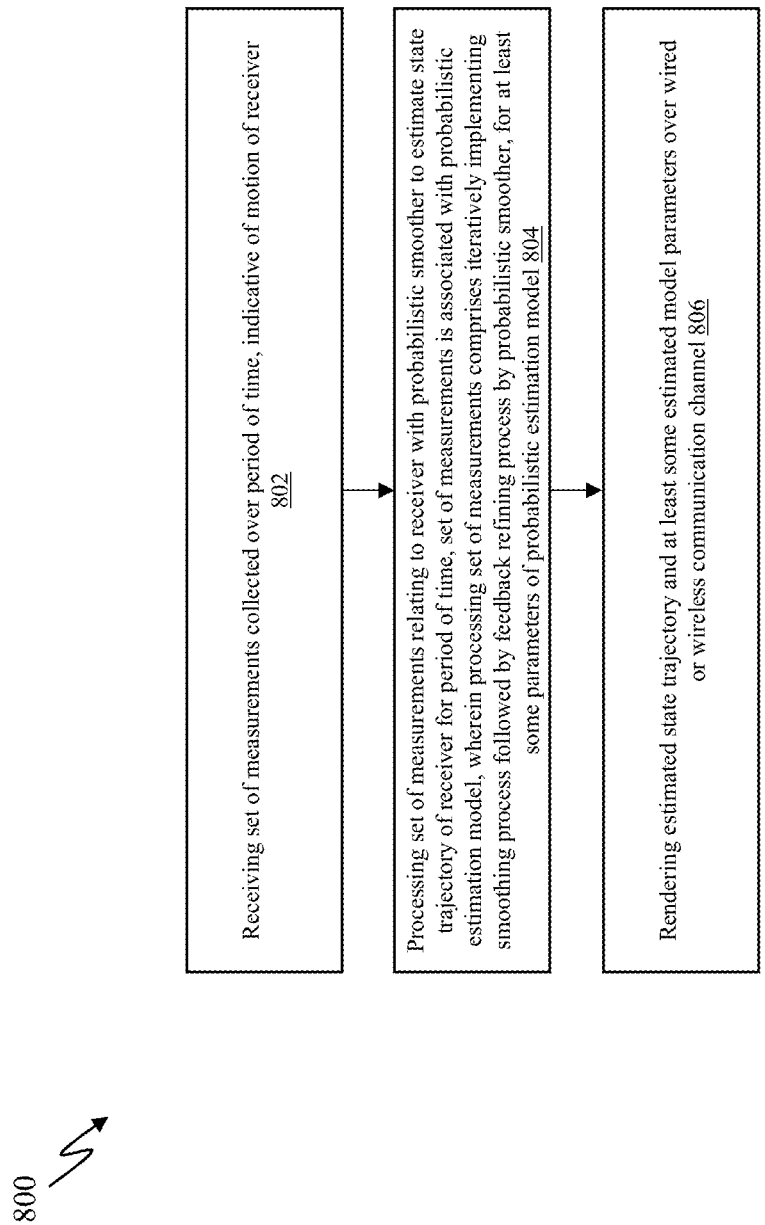

SYSTEM AND METHOD FOR TRACKING STATE OF RECEIVER OF GLOBAL NAVIGATIONAL SATELLITE SYSTEM

TECHNICAL FIELD

The present disclosure relates generally to positioning systems, such as the global positioning system (GPS) or the Quasi-Zenith Satellite System (QZSS), and more particularly to estimating a state of a satellite receiver in post processing based on a probabilistic estimation model.

BACKGROUND

A Global Navigation Satellite System (GNSS) comprises a set of satellites that may be used for determining a geographic location of a stationary or a mobile receiver with respect to the earth. Examples of the GNSS may include, but are not limited to, global positioning system (GPS), Galileo, Glonass, quasi-zenith satellite system (QZSS), and BeiDou.

In particular, various global navigation satellite (GNS) correction systems are configured to receive GNSS signal data from GNSS satellites. The GNS may be configured to process the GNSS signal data to calculate GNSS corrections from the GNSS signal data. These corrections may be provided to a receiver of the GNSS to enable quick and more accurate calculation of a geographic position of the receiver.

Typically, position estimation methods are used to determine a geographic position of the receiver. For example, geographic positions are calculated by the position estimation methods based on repeated measurements of pseudo-range observables and carrier phase observables by Earth-based GNSS receivers. Additionally, the time derivative of the carrier phase measurements can be sampled to gain information on the velocity of the receiver relative to a satellite. This type of observable is referred to as a Doppler measurement. In an example, a pseudo-range or code observable represents a difference between a transmit time of a GNSS satellite signal and a local receiving time of the GNSS satellite signal. Therefore, the pseudo-range or code observable includes a geometric distance covered by the GNSS satellite signal. Further, a measurement of an alignment between a carrier wave of the received GNSS satellite signal and a copy of the GNSS satellite signal generated inside the receiver provides another source of information for determining an apparent distance between a satellite and the receiver. The corresponding observable is called a carrier phase observable that represents an integrated value of a doppler frequency due to a relative motion of the satellite and the receiver.

However, any pseudo range observation comprises inevitable error contributions. The errors may be caused due to, for example, receiver and transmitter clock errors, other delays caused by non-zero refractivity of the atmosphere, instrumental delays, multipath effects, and detector noise. Further, any carrier phase observation may also comprise an unknown integer number of signal cycles. For example, the unknown integer number of signal cycles may include an unknown integer number of wavelengths that may have elapsed before a lock-in for a signal alignment is obtained. This unknown integer number is referred to as carrier phase ambiguity. To this end, the pseudo-ranges observables and the carrier phase observables are measured i.e., sampled by the receiver at discrete consecutive time steps. In an example, an index for a time step at which an observable is measured is referred to as an epoch.

Conventionally, the position estimation methods involve a dynamic numerical value estimation and correction scheme for distances and error components, based on measurements for the observables, i.e., the pseudo-ranges observables and the carrier phase observables, that may be sampled at consecutive epochs.

When multiple GNSS satellite signals are continuously tracked and no loss-of-lock occurs, certain integer ambiguity values resolved at beginning of a tracking phase may persist for entire GNSS positioning span. However, in certain conditions, the GNSS satellite signals may be occasionally occluded (such as due to buildings in urban environments), or momentarily blocked (such as when the receiver goes under a bridge or passes through a tunnel). In such cases, the integer ambiguity values are lost and must be re-determined. Such re-determination may take certain time, such as a few seconds to several minutes, causing estimation errors. Moreover, presence of significant multi-path errors or unmodeled systematic biases in one or more measurements of either pseudo-range observables or carrier phase observables may make it difficult to resolve the ambiguities for presently used commercial positioning systems. As a receiver separation (i.e., a distance between a reference receiver and a mobile receiver whose position is being determined) increases, distance-dependent biases (such as orbit errors, ionospheric effect and tropospheric effect) grow. Consequently, reliable ambiguity resolution (or re-initialization) becomes an even greater challenge. Alternatively, loss-of-lock may occur due to a discontinuity in a receiver's continuous phase lock on a signal, referred to as a cycle slip. For example, cycle slips may be caused by power loss, a failure of a receiver software, or a malfunctioning satellite oscillator. In addition, cycle slip may also be caused by changing ionospheric conditions. However, resolving ambiguities when loss-of-lock occurs is also challenging.

As may be noted, GNSS enhancement refers to techniques used to improve the accuracy of positioning information provided by the GPS or other GNSS using a network of satellites for navigation. For example, certain conventional methods for GNSS enhancement may use differencing techniques based on differencing between satellites, differencing between receivers, differencing between epochs, or a combination thereof. For example, single and double differences between satellites and receivers reduce error sources. However, conventional differencing techniques fail to completely eliminate the error sources.

In certain cases, multiple frequency bands are used. In a GPS constellation, frequency bands may include carrier frequencies of, for example, 1575.42 MHZ (the L1 band), 1227.6 MHZ (the L2 band), and 1176 MHZ (the L5 band). Analogous to the differencing techniques, underlying radio physics may be used to combine several observations on multiple frequency bands to form ionosphere free combinations. This may further reduce the impact of ionospheric modeling errors on the position estimates.

However, despite these modeling approaches, there is a need to increase the accuracy of GNSS positioning estimation beyond such conventional methods. To address certain problems associated with positioning estimation, some approaches cast a positioning problem in a smoothing setting, where data is received in batches and where an estimate of position at any given time may be computed not only from past and current measurements but also using future measurements in the received batch of data. This differs from filtering approaches, in which a current estimate of position is based on past and present data and computed in real time. The advantage of a smoothing solution is that it strictly improves performance when compared to a filtering solution, at an increased computational cost and a requirement of being run offline or at a delay equal to the length of the batch of data. Smoothing solutions are typically referred to as post-processing algorithms (PPAs). Examples of algorithms for performing smoothing post processing includes, for example, Kalman smoothing in Fraser-Potter (FP) based algorithms, and Rauch-Tung-Striebel (RTS) framework-based algorithms. Other smoothing post processing may include factor-graph optimization (FGO).

It may be noted that smoothing is a problem of estimating an unknown probability density function of a state trajectory considered over multiple time steps using past, present, and future measurements. This is possible in a post-processing scenario, where a batch of measurements have been taken and are used as input to a smoothing algorithm or a smoother. The smoother is an algorithm that implements a solution to this problem, typically based on Bayesian techniques. For example, many types of Kalman smoothers may use estimation models that include a prediction model subject to process noise and a measurement model subject to measurement noise.

However, these smoothing algorithms rely on well-defined estimation models, and any error in the estimation model or its parameters may cause performance degradations. The smoothers assume that at least a subset of the parameters of the estimation model are known a prior, which may not be always feasible. Hence, there is a need for methods that adapt the estimation model in a safe data-driven manner while simultaneously estimating the states of the receiver (biases, position, velocity, etc.). There is a need to improve the estimation model in GNSS positioning post-processing to permit a safe update of the model parameters and thus improve estimation performance for GNSS post processing and accurate positioning estimation.

SUMMARY

It is an object of some embodiments to disclose a system, a method and a computer program product for tracking the state of a receiver of a global navigational satellite system (GNSS) based on iterative feedback smoothing. It is another object of some embodiments to disclose a system, a method and a computer program product for enabling a feedback mechanism for parameter adaptation. It is yet another object of some embodiments to disclose a system, a method and a computer program product relating to the GNSS post processing application.

Some embodiments are based on a recognition that considering a structure and a purpose of parameters of a probabilistic estimation model for the GNSS tracking, at least some parameters of the probabilistic estimation model affect state tracking more than others.

Some embodiments are based on a recognition that the probabilistic estimation model may include parameters defining for example, kinematic states of the receiver, clock drifts, ionospheric delays, troposphere delays, correction terms, as well as integer ambiguity biases associated with the receiver. Therefore, it may be computationally challenging to update each of the parameters of the probabilistic estimation model.

Some embodiments are based on a recognition that it may be sufficient to update only the parameters indicative of the kinematic state. In one embodiment, the parameters related to for example, Wiener process(es) that drive random walks of the kinematic states of the receiver may be updated. In some implementations, the parameters of the kinematic states may be updated iteratively before a termination condition is reached and subsequently integer ambiguity biases are updated upon reaching the termination condition based on refined or the updated parameters of the probabilistic estimation model. Moreover, the kinematic states of the receiver may be updated based on the updated integer ambiguity biases.

Consequently, some embodiments are based on a recognition that probabilistic smoothers may generate more accurate predictions of the state variables of the receiver than filters, as the probabilistic smoothers are non-causal and may more accurately describe spatial distribution of the variables of interest, such as the state variables. To that end, it is an object of some embodiments to track the state of the GNSS receiver using post-processing techniques implemented using probabilistic smoothers in the Fraser-Potter (FP) and Rauch-Tung-Striebel (RTS) frameworks.

Some embodiments are based on a realization that the smoothing may track the state as a function of the parameters of the probabilistic estimation model. Further, results of the tracking may be used as a feedback loop to update the parameters of the probabilistic estimation model. Specifically, a metric indicative of a measurement likelihood given parameters may be used as an indication of the correctness of the parameters. However, it may be understood that computing such measurement likelihood may be a computationally expensive process, rendering it infeasible for a direct minimization over the parameters for large estimation models. Instead, it may be possible to construct a majorant function to negative log likelihood, which may be minimized efficiently, even analytically in some cases. As a result, some embodiments may use iterative feedback smoothing that may iteratively implement smoothing followed by feedback refining of at least some parameters of the probabilistic estimation model until a termination condition is met. The smoothing updates the state trajectory to explain the measurements given parameters of the probabilistic estimation model while the feedback refining updates at least some parameters of the probabilistic estimation model to improve a metric indicative of a measurement likelihood given the updated parameters.

One embodiment discloses a system for tracking the state of a receiver of a global navigational satellite system (GNSS) based on iterative feedback smoothing. The system comprises a processor and a memory having instructions stored thereon that causes the processor to receive a set of measurements indicative of a motion of the receiver, the set of measurements being collected over a period of time. The set of measurements relate to satellite signals including a combination of a carrier phase and one or more code signals transmitted from a set of GNSS satellites and sensed by the receiver at different instances of time within the period of time. The processor may further process the set of measurements relating to the receiver with a probabilistic smoother to estimate a state trajectory of the receiver for the period of time, the set of measurements is associated with a probabilistic estimation model. The probabilistic smoother iteratively implements a smoothing process followed by a feedback refining process of for at least some parameters of the probabilistic estimation model until a termination condition is met. The smoothing process updates the state trajectory indicating the set of measurements based on the at least some parameters of the probabilistic estimation model. The feedback refining process updates the at least some parameters of the probabilistic estimation model to improve a metric indicative of a measurement likelihood. The processor further renders the estimated state trajectory and the updated at least some parameters over a wired or wireless communication channel. In some embodiments, the feedback refining process causes to update only the at least some parameters of the probabilistic estimation model. In some embodiments, the feedback refining process updates the at least some parameters of the probabilistic estimation model indicative of a kinematic state of the receiver.

In some embodiments, the feedback refining process may cause to update the at least some parameters of the probabilistic estimation model relating to stochastic processes that drive random walks of one or more kinematic states of the receiver.

In some embodiments, the feedback refining process may cause to iteratively update the at least some parameters of the probabilistic estimation model relating to stochastic processes until the termination condition is met, and further causes to estimate integer ambiguity biases of the probabilistic estimation model to produce the rendered state trajectory.

In some embodiments, the feedback refining process may cause to update the at least some parameters of the probabilistic estimation model based on an expectation maximization (EM) method to guarantee a monotonic improvement of the updated parameters with respect to the measurement likelihood for each EM iteration, such that intermediate smoothing solutions are discarded.

In some embodiments, the processor may be further configured to construct an objective Q-function for parameter-optimization of the at least some parameters, using the smoothing process of a relaxed estimation problem, wherein the relaxed estimation problem is a biconvex function that majorizes a negative measurement log-likelihood.

In some embodiments, the Q-function may be formed such that arguments of the Q-function are all or some of at least one of: parameters relating to maps and functions of the probabilistic estimation model.

In some embodiments, the Q-function may be formed such that the arguments of the Q-function are a set of parameters parametrizing at least one or more of: functions and matrices defining a measurement model, the inverse covariance matrices, the functions and matrices defining a prediction model, the construction of the probabilistic estimation models.

In some embodiments, the Q-function is such that the Q-function is minimized with a regularizing term to promote assumed sparsity patterns in the resulting probabilistic estimation model.

In some embodiments, the processor may be further configured to implement the probabilistic estimation model using at least one of an embedded system, parallel processing, or an entity taking advantage of computational hardware.

In some embodiments, the processor may be further configured to perform the smoothing process using an approximate Gaussian fixed-interval smoother, wherein the Gaussian fixed-interval smoother comprises at least one of: Rauch-Tung-Striebel smoother, Fraser-Potter smoother, or factor graph optimization smoother, the smoothing process being performed using at least one of: explicit, or statistical linearization methods to resolve nonlinearities of the probabilistic estimation model.

In some embodiments, the probabilistic estimation model may be formed for a plurality of receivers wherein an estimation problem is formed to jointly estimate state trajectories of the plurality of receivers.

In some embodiments, one or more biases of the probabilistic estimation model for each of the plurality of receivers may be described as identical due to a geographical proximity between them.

In some embodiments, the plurality of receivers may be mounted on vehicles, wherein the plurality of receivers is configured to determine a position of a corresponding vehicle.

In some embodiments, the plurality of receivers may be mounted on aquatic buoys, wherein the plurality of receivers is configured to determine sporadic changes during at least one of seismic, or irrigation events, using parameter adaptation of the probabilistic estimation model.

Another embodiment discloses a method for tracking the state of a receiver of a global navigational satellite system (GNSS) based on iterative feedback smoothing. The method comprises receiving a set of measurements indicative of a motion of the receiver, the set of measurements being collected over a period of time wherein the set of measurements relate to satellite signals including a combination of a carrier phase and one or more code signals transmitted from a set of GNSS satellites and sensed by the receiver at different instances of time within the period of time. The method further comprises processing the received set of measurements relating to the receiver with a probabilistic smoother to estimate a state trajectory of the receiver for the period of time, the set of measurements is associated with a probabilistic estimation model. The processing the motion data comprises iteratively implementing a smoothing process followed by a feedback refining process by the probabilistic smoother, for at least some parameters of the probabilistic estimation model until a termination condition is met. The smoothing process comprises updating the state trajectory indicating the set of measurements based on the at least some parameters of the probabilistic estimation model. The feedback refining process comprises updating the at least some parameters of the probabilistic estimation model to improve a metric indicative of a measurement likelihood. The method further comprises rendering the estimated state trajectory and the updated at least some parameters over a wired or wireless communication channel.

In some embodiments, the feedback refining process may include updating only the at least some parameters of the probabilistic estimation model.

In some embodiments, the feedback refining process may include updating the at least some parameters of the probabilistic estimation model indicative of a kinematic state of the receiver.

Yet another embodiment discloses a non-transitory computer readable storage medium embodied thereon a program executable by a processor for performing a method for tracking a state of a receiver of a global navigational satellite system (GNSS) based on iterative feedback smoothing. The method comprises receiving a set of measurements indicative of a motion of the receiver, the set of measurements being collected over a period of time wherein the set of measurements relate to satellite signals including a combination of a carrier phase and one or more code signals transmitted from a set of GNSS satellites and sensed by the receiver at different instances of time within the period of time. The method further comprises processing the received set of measurements relating to the receiver with a probabilistic smoother to estimate a state trajectory of the receiver for the period of time, the set of measurements is associated with a probabilistic estimation model. The processing the set of measurements comprises iteratively implementing a smoothing process followed by a feedback refining process by the probabilistic smoother, for at least some parameters of the probabilistic estimation model until a termination condition is met. The smoothing process comprises updating the state trajectory indicating the set of measurements based on the at least some parameters of the probabilistic estimation model. The feedback refining process comprises updating the at least some parameters of the probabilistic estimation model to improve a metric indicative of a measurement likelihood. The method further comprises rendering the estimated state trajectory and the updated at least some parameters over a wired or wireless communication channel.

BRIEF DESCRIPTION OF THE DRAWINGS

FIG. 3F shows a diagram illustrating probability density functions used to model the cycle slip events, and an integer random walk process used to model time evolution of integer ambiguity biases, according to an embodiment of the present disclosure.

FIG. 8 illustrates a flow chart depicting a method for tracking the state of the receiver based on the iterative feedback smoothing, according to an embodiment of the present disclosure.

DETAILED DESCRIPTION

In the following description, for purposes of explanation, numerous specific details are set forth in order to provide a thorough understanding of the present disclosure. It will be apparent, however, to one skilled in the art that the present disclosure may be practiced without these specific details. In other instances, apparatuses and methods are shown in block diagram form only in order to avoid obscuring the present disclosure. Contemplated are various changes that may be made in the function and arrangement of elements without departing from the spirit and scope of the subject matter disclosed as set forth in the appended claims.

As used in this specification and claims, the terms "for example," "for instance," and "such as," and the verbs "comprising," "having," "including," and their other verb forms, when used in conjunction with a listing of one or more components or other items, are each to be construed as open ended, meaning that the listing is not to be considered as excluding other, additional components or items. The term "based on" means at least partially based on. Further, it is to be understood that the phraseology and terminology employed herein are for the purpose of the description and should not be regarded as limiting. Any heading utilized within this description is for convenience only and has no legal or limiting effect.

Specific details are given in the following description to provide a thorough understanding of the embodiments. However, understood by one of ordinary skill in the art can be that the embodiments may be practiced without these specific details. For example, systems, processes, and other elements in the subject matter disclosed may be shown as components in block diagram form in order not to obscure the embodiments in unnecessary detail. In other instances, well-known processes, structures, and techniques may be shown without unnecessary detail to avoid obscuring the embodiments. Further, like reference numbers and designations in the various drawings indicated like elements.

Figure 1A:
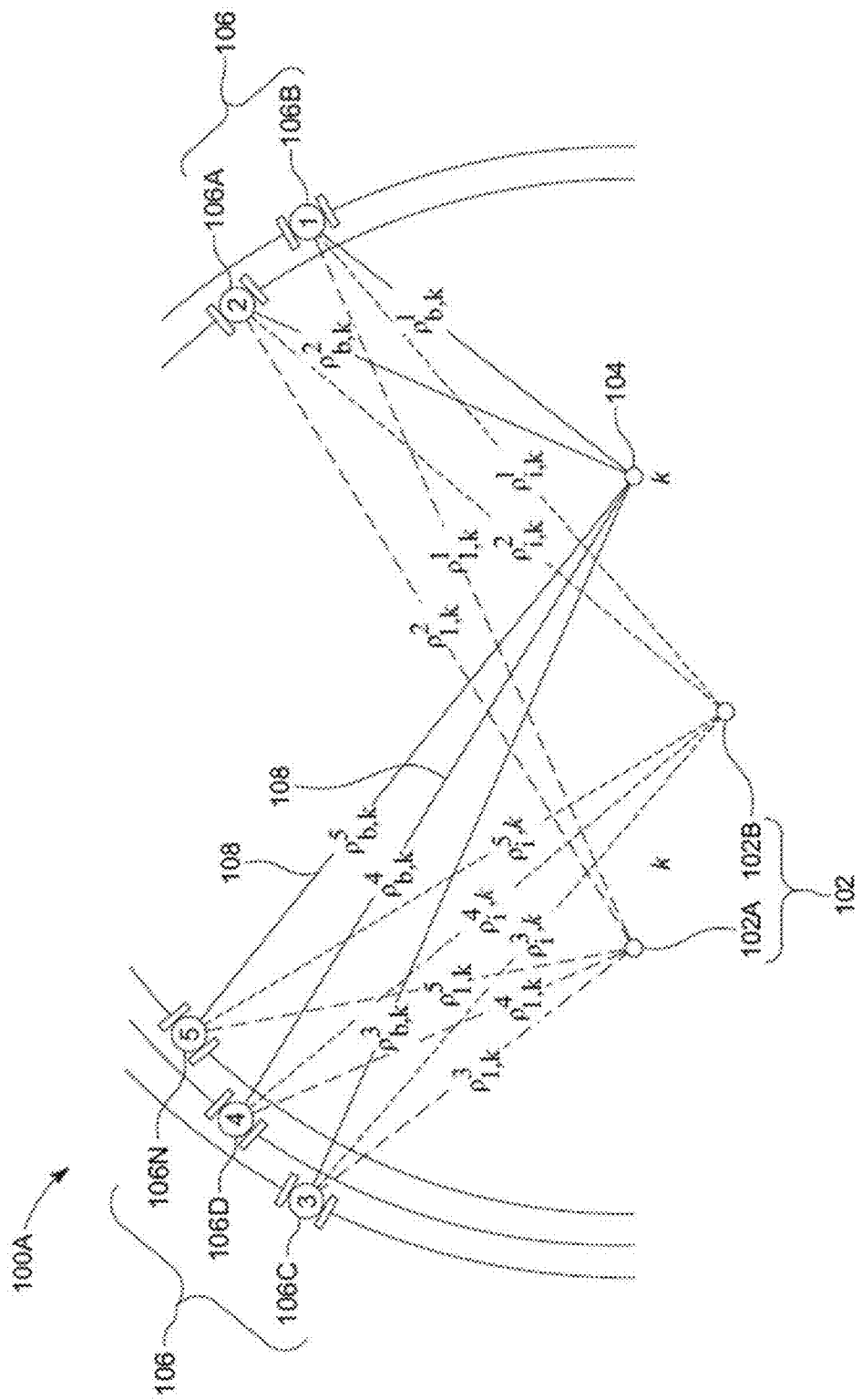
FIG. 1A shows a schematic diagram of a global navigation satellite system (GNSS), according to an embodiment of the present disclosure.

FIG. 1A shows a schematic diagram 100A of a global navigation satellite system (GNSS), according to some embodiments. The schematic diagram 100A may include a plurality of receivers 102, a base station 104, and a set of GNSS satellites 106. The plurality of receivers 102 may include a receiver 102A and a receiver 102B. The set of GNSS satellites 106 may include a satellite 106A, a satellite 106B, a satellite 106C, a satellite 106D and a satellite 106N.

In some embodiments, the plurality of receivers 102 and the base station 104 may differ. For example, in an embodiment a position of the base station 104 may be known and may be mounted on ground. In contrast, the plurality of receivers 102 may be either mobile and assumed to be in motion or stationary receivers, but in either case, the positions of the plurality of receivers 102 may be unknown. For instance, the plurality of receivers 102 may be mounted on various devices such as a cell phone, a vehicle, or a tablet. In all described embodiments, there may be multiple GNSS receivers in the plurality of receivers 102 that may be configured to receive code and carrier phase signals, and a number of the receivers in the plurality of receivers 102 may be large. In some embodiments, the base station 104 may be moving, and in other embodiments, the base station 104 may not have a known position.

The set of GNSS satellites 106 may include a number of satellites from many different constellations, including but not limited to the Global Positioning System (GPS), Galileo satellite, Global Navigation Satellite System (GLONASS), Quasi-Zenith Satellite System (QZSS), and BeiDou Navigation Satellite (BDS) system. Some embodiments of the set of GNSS satellites 106 may use one or multiple carrier frequency bands per satellite.

The plurality of receivers 102, such as the receiver 102A and the receiver 102B may receive radio signals that may be processed by the plurality of receivers 102 to yield a set of measurements. In an embodiment, the plurality of receivers 102 may include a processor configured to generate the set of measurements. For example, the set of measurements relate to satellite signals including a combination of a carrier phase and one or more code signals, such as a pseudo-range, carrier-phase and doppler measurements, along with other signals indicative of a quality of radio communication between the plurality of receivers 102, the base station 104 and the set of GNSS satellites 106.

Moreover, the set of measurements may relate to a geometric range 108 and a time derivative of the geometric range 108 by a set of biases. For example, the geometric range 108 may be a Euclidean distance between coordinates of the set of GNSS satellites 106 and the plurality of receivers 102 at a transmission time and a reception time. In some embodiments, the set of measurements taken from the plurality of receivers 102 may be combined with measurements taken by a known base station, such as the base station 104 to attenuate sources of error in the set of measurements. In an example, a set of pseudo-range, carrier-phase and doppler measurements of the set of measurements may be received per satellite of the set of GNSS satellites 106 seen by the plurality of receivers 102 on each epoch and may be processed locally in the plurality of receivers 102 by use of the processor.

Collectively, the GNSS signals sampled in a receiver, comprising carrier phase, pseudo range (code) and possibly doppler measurements (the time derivative of the carrier phase) from one or multiple frequency bands in one or multiple GNSS constellations are referred to as GNSS measurements. Further, additional measurements may be obtained from sensors for example, an inertial measurement unit (IMU), barometers, cameras and so forth. The set of measurements may comprise both the GNSS measurements and the additional measurements. The set of measurements is explained in additional detail in relation to FIGS. 2A and 2B.

Figure 1B:
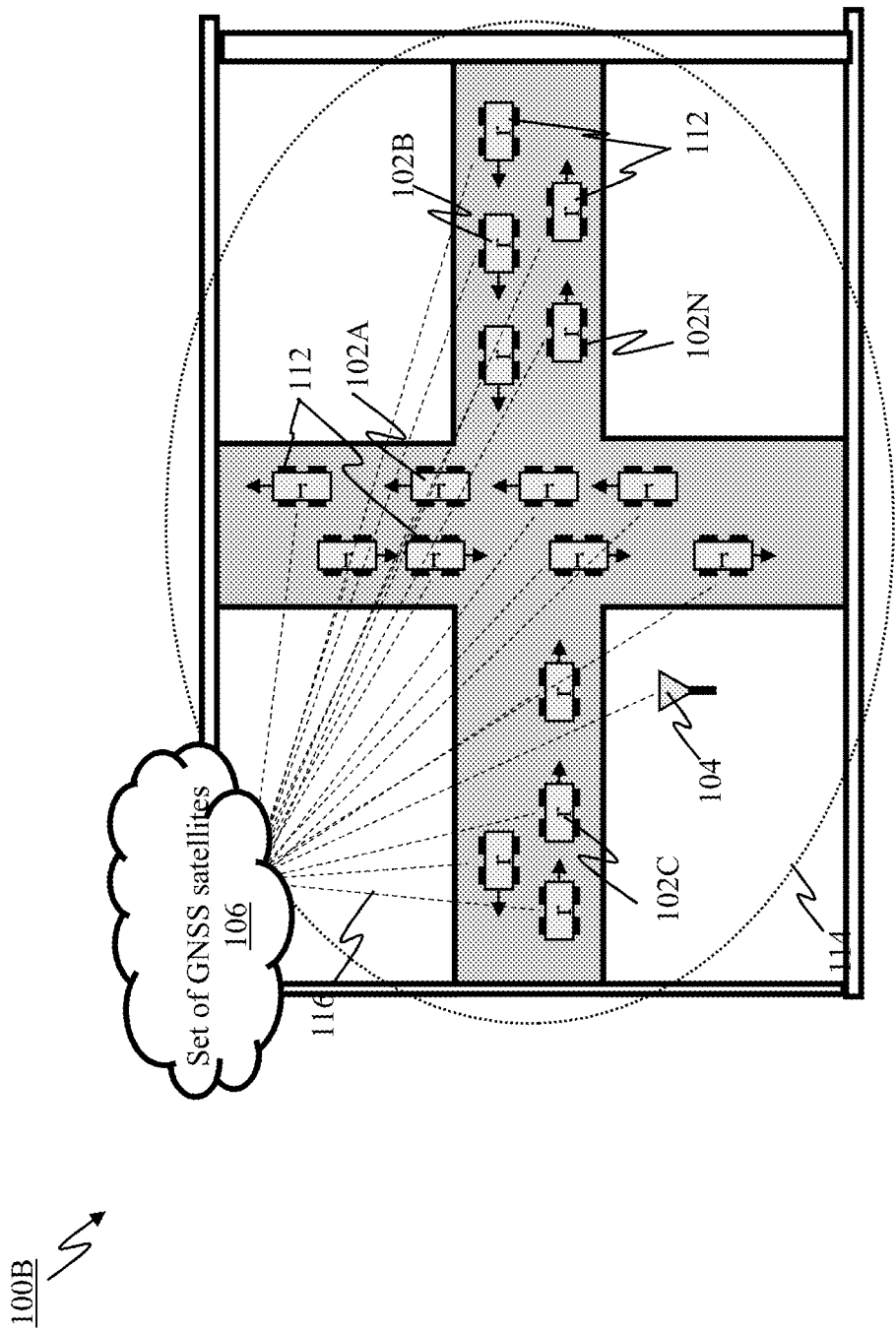
FIG. 1B shows a schematic diagram depicting an exemplary urban driving scenario to estimate positions of a plurality of receivers mounted on a plurality of vehicles, according to an embodiment of the present disclosure.

FIG. 1B shows a schematic diagram 100B depicting an exemplary urban driving scenario to estimate positions of the plurality of receivers 102 mounted on a plurality of vehicles 112, according to an embodiment of the present disclosure. FIG. 1B is explained in conjunction with elements of FIG. 1A. The schematic diagram 100B includes the plurality of receivers 102. The plurality of receivers 102 may include for example, the receiver 102A, the receiver 102B, a receiver 102C and a receiver 102N. The schematic diagram 100B may further include the set of GNSS satellites 106 and the base station 104. The plurality of receivers 102, the set of GNSS satellites 106 and the base station 104 may communicate via a radio communication 116.

The urban driving scenario illustrates an intersection where the base station 104 may be included in adaptive post processing algorithm of the received set of measurements from the plurality of receivers 102 to accurately reconstruct state trajectories of the plurality of vehicles 112 at the intersection. In some embodiments, the base station 104 may be a part of a roadside unit (RSU) that may optionally be used to control the intersection.

In some embodiments, the plurality of receivers 102 may be mounted on vehicles. The plurality of receivers 102 may be configured to determine a position of a corresponding vehicle. In an example, plurality of receivers 102 is attached to the plurality of vehicles 112 in a four-way crossing, and the base station 104 may be located nearby, and a position of the plurality of vehicles 112 may be estimated in a region 114 near the intersection. Due to proximity of the plurality of receivers 102, and the use of the same base station 104 and the same set of GNSS satellites 106, there exist correlations between the set of measurements that gives rise to correlated state estimates. However, an exact magnitude of the correlated measurement noise covariance may be unknown, and inferring the noise levels in the adaptive post processing algorithm may therefore improve estimation performance, as opposed to assuming a known noise level in the post processing algorithm.

Figure 1C:
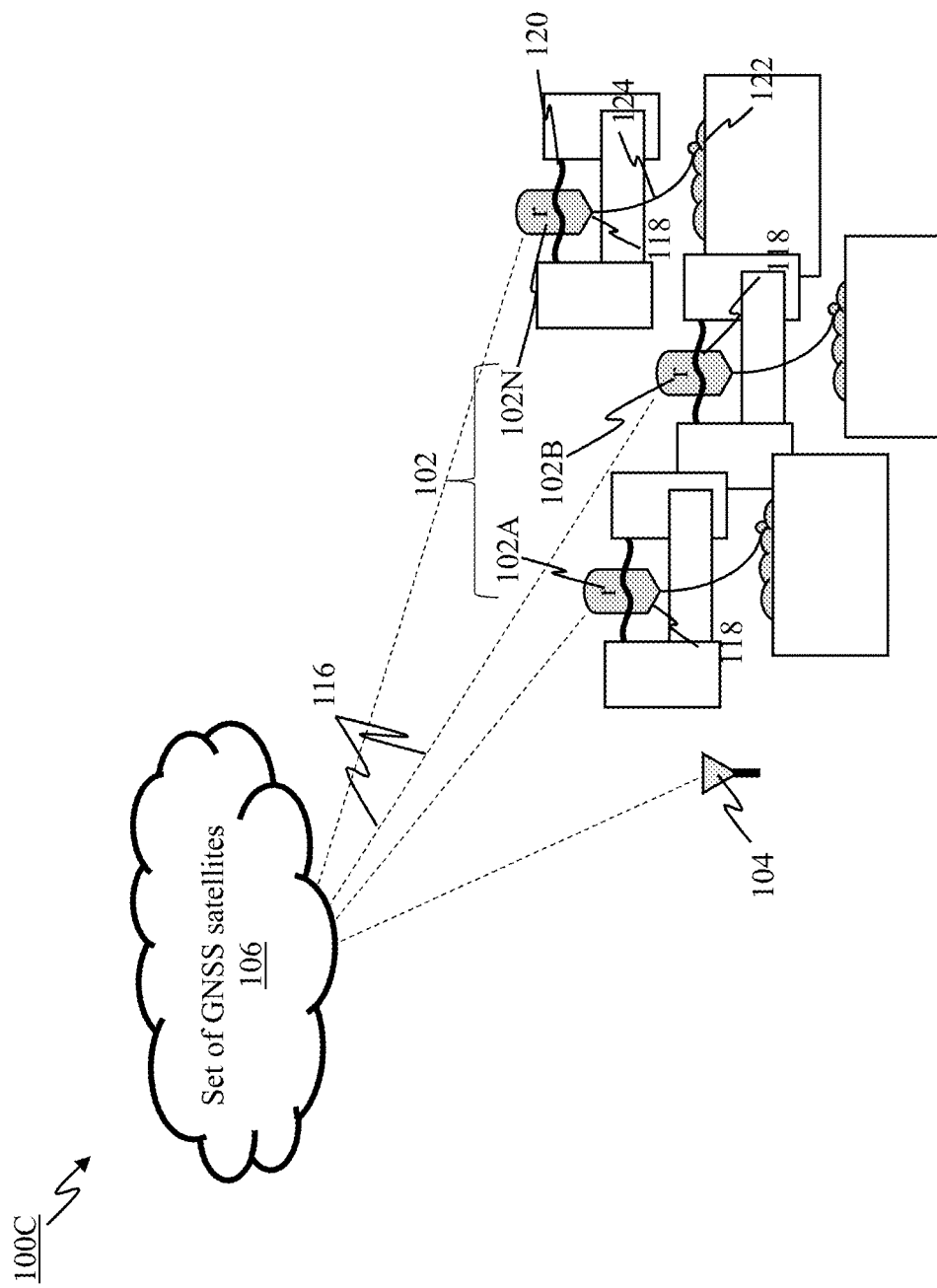
FIG. 1C shows a schematic diagram depicting an exemplary aquatic monitoring scenario to estimate positions of the plurality of receivers mounted to a plurality of buoys, according to an embodiment of the present disclosure.

FIG. 1C shows a schematic diagram 100C depicting an exemplary aquatic monitoring scenario to estimate positions of the plurality of receivers 102 mounted to a plurality of buoys 118, according to an embodiment of the present disclosure. FIG. 1C is explained in conjunction with elements of FIG. 1A and FIG. 1B. The schematic diagram 100C includes the set of GNSS satellites 106, the base station 104 and the plurality of receivers 102 mounted to the plurality of buoys 118. The plurality of receivers 102, the set of GNSS satellites 106 and the base station 104 may communicate via the radio communication 116.

The aquatic monitoring scenario relates to environmental monitoring, such as positions of aquatic surface buoys, for example, the plurality of buoys 118 may be estimated. In some embodiments, the plurality of receivers 102 may be mounted on aquatic buoys, such as the plurality of buoys 118. The plurality of receivers 102 may be configured to determine sporadic changes during at least one of seismic, or irrigation events, using parameter adaptation of a probabilistic estimation model. The probabilistic estimation model is clarified in relation to FIG. 1E, FIG. 3D, FIG. 3G, and details explicitly in Equations 1-4 and 22-24. In an embodiment, the probabilistic estimation model may be formed for the plurality of receivers 102, such that an estimation problem is formed to jointly estimate state trajectories of the plurality of receivers 102. Each of the plurality of buoys 118 may be equipped with an antenna, such as a receiver of the plurality of receivers 102. The plurality of receivers 102 may be above a water level 120. In some embodiments, the plurality of buoys 118 may be attached to an ocean floor 122 with a mooring chain 124. In the example, the base station 104 may communicate with the set of GNSS satellites 106 using the radio communication 116.

In some embodiments, the plurality of buoys 118 may be placed in water bodies, such as water reservoirs and lakes. In such a case, the plurality of buoys 118 may monitor changes in the water level 120 over long time scales, where sudden changes due to events such as rain or irrigation events imply that dynamics of a buoy of the plurality of buoys 118 may differ in time. In one or more embodiments, the plurality of buoys 118 may be placed in other types of water bodies such as an ocean. In such a case, the plurality of buoys 118 may monitor changes in the water level 120 due to events such as seismic events, where the water level 120 similarly is constant with small sporadic and abrupt changes. In both cases, prediction models and the resulting estimation problems may differ significantly in periods of relative lulls and periods with sporadic events. As such, to improve positioning performance in the post processing of the set of measurements during such events, it may be necessary to adapt parameters of the probabilistic estimation model in a data-driven manner.

Figure 1D:
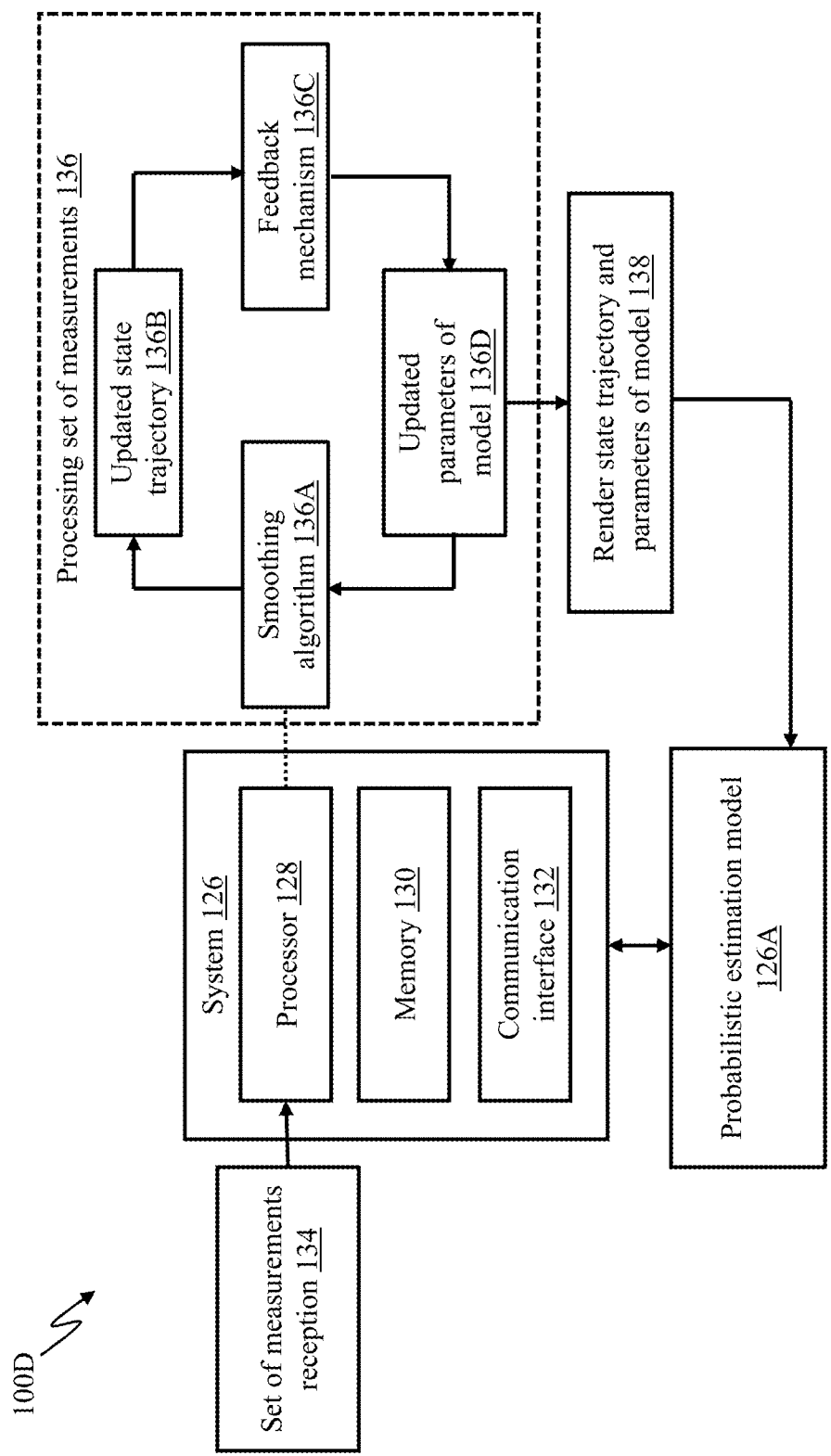
FIG. 1D shows a diagram of a system utilizing feedback mechanism for updating parameters of a probabilistic estimation model, according to an embodiment of the present disclosure.

FIG. 1D shows a diagram 100D of a system 126 utilizing feedback mechanism for updating parameters of a probabilistic estimation model 126A, according to an embodiment of the present disclosure. FIG. 1D is explained in conjunction with elements of FIG. 1A, FIG. 1B and FIG. 1C. The diagram 100D includes the system 126. The system 126 may include a processor 128, a memory 120 and a communication interface 132. The diagram 100D depicts steps for utilizing the feedback mechanism for updating parameters of the probabilistic estimation model.

The system 126 may be configured to perform one or more operations, such as updating the parameters of the probabilistic estimation model. In an example embodiment, the system 126 may be embodied in one or more of several ways as per the required implementation. For example, the system 126 may be embodied as a cloud-based service or a cloud-based platform. In each of such embodiments, the system 126 may be communicatively coupled to the components such as the plurality of receivers 102, the set of GNSS satellites 106 and the base station 104 to carry out the desired operations, and wherever required modifications may be possible within the scope of the present disclosure. The system 126 may further be implemented in devices, such as the plurality of vehicles 112. Further, in one embodiment, the system 126 may be a standalone unit configured to update the parameters of the probabilistic estimation model.

Alternatively, the system 126 may be associated with service providers such as navigation service providers. For example, the navigation service providers may be map application providers.

The system 126 may include the processor 128, the memory 130 and the communication interface 132. The processor 128, the memory 130 and the communication interface 132 may be communicatively coupled to each other. In some example embodiments, the system 126 may comprise a processing means such as a central processing unit (CPU), storage means such as read only memory (ROM) and random-access memory (RAM), a display enabled user interface such as a touch screen display, and other components as may be required for specific functionalities of system 126. Additional, different, or fewer components may be provided. For example, the system 126 may be configured to execute and run mobile applications such as the navigation application.

The processor 128 may be embodied in several ways. For example, the processor 128 may be embodied as one or more of various hardware processing means such as a coprocessor, a microprocessor, a controller, a digital signal processor (DSP), a processing element with or without an accompanying DSP, or various other processing circuitry including integrated circuits such as, for example, an ASIC (application specific integrated circuit), an FPGA (field programmable gate array), a microcontroller unit (MCU), a hardware accelerator, a special-purpose computer chip, or the like. As such, in some embodiments, the processor 128 may include one or more processing cores configured to perform independently. A multi-core processor may enable multiprocessing within a single physical package. Additionally, or alternatively, the processor 128 may include one or more processors configured in tandem via the bus to enable independent execution of instructions, pipelining and/or multithreading.

Additionally, or alternatively, the processor 128 may include one or more processors capable of processing large volumes of workloads and operations to provide support for large data analysis. In an example embodiment, the processor 128 may be in communication with the memory 130 via a bus for passing information among components coupled to the system 126.

The memory 130 may be non-transitory and may include, for example, one or more volatile and/or non-volatile memories. In other words, for example, the memory 130 may be an electronic storage device (for example, a computer readable storage medium) comprising gates configured to store data (for example, bits) that may be retrievable by a machine (for example, a computing device like the processor 128). The memory 130 may be configured to store information, data, content, applications, instructions, or the like, for enabling the apparatus to carry out various functions in accordance with an example embodiment of the present disclosure. For example, the memory 130 may be configured to buffer input data for processing by the processor 128. As exemplarily illustrated in FIG. 1D, the memory 130 may be configured to store instructions for execution by the processor 128. As such, whether configured by hardware or software methods, or by a combination thereof, the processor 128 may represent an entity (for example, physically embodied in circuitry) capable of performing operations according to an embodiment of the present disclosure while configured accordingly. Thus, for example, when the processor 128 is embodied as an ASIC, FPGA or the like, the processor 128 may be specifically configured hardware for conducting the operations described herein. Alternatively, as another example, when the processor 128 is embodied as an executor of software instructions, the instructions may specifically configure the processor 128 to perform the algorithms and/or operations described herein when the instructions are executed. However, in some cases, the processor 128 may be a processor specific device (for example, a mobile terminal or a fixed computing device) configured to employ an embodiment of the present disclosure by further configuration of the processor 128 by instructions for performing the algorithms and/or operations described herein. The processor 128 may include, among other things, a clock, an arithmetic logic unit (ALU) and logic gates configured to support operation of the processor 128.

The communication interface 132 may comprise input interface and output interface for supporting communications to and from the system 126 or any other component with which the system 126 may communicate. The communication interface 132 may be any means such as a device or circuitry embodied in either hardware or a combination of hardware and software that is configured to receive and/or transmit data to/from a communications device in communication with the system 132. In this regard, the communication interface 132 may include, for example, an antenna (or multiple antennae) and supporting hardware and/or software for enabling communications with a wireless communication network. Additionally, or alternatively, the communication interface 132 may include the circuitry for interacting with the antenna(s) to cause transmission of signals via the antenna(s) or to handle receipt of signals received via the antenna(s). In some environments, the communication interface 132 may alternatively or additionally support wired communication. As such, for example, the communication interface 132 may include a communication modem and/or other hardware and/or software for supporting communication via cable, digital subscriber line (DSL), universal serial bus (USB) or other mechanisms.

At step 134, the set of measurements may be received. The processor 128 may be configured to receive the set of measurements. The set of measurements is associated with the probabilistic estimation model. In an embodiment, the probabilistic estimation model 126A may be formed for the plurality of receivers 102, such that an estimation problem is formed to jointly estimate state trajectories of the plurality of receivers 102. The processor 128 may receive the set of measurements indicative of a motion of a receiver, such as the receiver 102A of the plurality of receivers 102. In an exemplary scenario, the vehicle having the receiver 102A on board may be travelling. The set of measurements may be collected over a period of time from the receiver 102A. The set of measurements received from the receiver 102A may indicate the motion of the receiver 102A. The set of measurements may relate to the satellite signals including the combination of the carrier phase and one or more code signals, such as a pseudo-range, carrier-phase and doppler measurements, along with other signals indicative of a quality of the radio communication 116 between the receiver 102A, the base station 104 and the set of GNSS satellites 106. The set of measurements may be sensed by the receiver 102A at different instances of time within the period of time.

At step 136, the set of measurements may be processed. The processor 128 may be configured to process the set of measurements relating to the receiver 102A. The processor 128 may utilize a probabilistic smoother to estimate a state trajectory of the receiver 102A for the period of time. After the estimation of the state trajectory, the processor 128 may perform a feedback refining process for the at least some parameters of the probabilistic estimation model. In some embodiments, the probabilistic estimation model 126A may be implemented by use of an embedded system, parallel processing, or an entity taking advantage of computational hardware.

At step 136A, to process the set of measurements, the probabilistic smoother utilizes a smoothing algorithm to iteratively implement a smoothing process for at least some parameters of the probabilistic estimation model 126A until a termination condition is met. The smoothing process may cause to update the state trajectory 136B indicating the set of measurements based on the at least some parameters of the probabilistic estimation model. The smoothing algorithm or an estimation algorithm may be configured to compute a posterior estimate, such as the posterior state trajectory 136B. Details of an exemplary smoothing algorithm and the at least some parameters update are further provided, for example, in FIGS. 1E, 1F, 1G, 3A and 4A. Moreover, details of an embodiment relating to the GNSS post processing application are elaborated upon in relation to FIGS. 3B, 3C, 3D, 3E, 3F, 3G, 4A and 5A.

At step 136C, to process the set of measurements, the processor 128 may be configured to perform the feedback refining process for the at least some parameters 136D of the probabilistic estimation model 126A until the termination condition is met. In some embodiments, the feedback refining process may cause to update only the at least some parameters 136D of the probabilistic estimation model. The feedback refining process may cause to update the at least some parameters 136D of the probabilistic estimation model 126A to improve a metric indicative of a measurement likelihood. For example, the posterior state trajectory 136B may be used as input in the feedback refining process, that may seek to update and improve the at least some parameters 136D used in the smoothing algorithm during computation of the posterior state trajectory 136B.

In some embodiments, the feedback refining process may cause to update the at least some parameters 136D of the probabilistic estimation model 126A indicative of a kinematic state of the receiver, such as the receiver 102A. As the receiver 102A. may be arranged on the vehicle that may be travelling, the at least some parameters 136D may indicate the kinematic state (such as a moving state) of the 102A (or the vehicle).

In some embodiments, the feedback refining process may cause to update the at least some parameters 136D of the probabilistic estimation model 126A relating to stochastic processes that drive random walks of one or more kinematic states of the receiver 102A. The parameters related to for example, the inverse variance of Wiener process(es) that drive the random walks of the kinematic states of the receiver 102A may be updated. The Wiener process may be utilized to determine the error in the kinematic measurements to update the at least some parameters 136D.

In some embodiments, the feedback refining process may cause to iteratively update the at least some parameters 136D of the probabilistic estimation model 126A relating to stochastic processes until the termination condition is met. The feedback refining process may further cause to estimate integer ambiguity biases of the probabilistic estimation model 126A to produce the rendered state trajectory. In some implementations, the parameters of the kinematic states may be updated iteratively before the termination condition is reached and subsequently the integer ambiguity biases may be updated upon reaching the termination condition based on refined or the updated at least some parameters 136D of the probabilistic estimation model. Moreover, the kinematic states of the receiver 102A may be updated based on the updated integer ambiguity biases. In some embodiments, one or more biases of the probabilistic estimation model 126A for each of the plurality of receivers 102 are described as being identical due to a geographical proximity between the plurality of receivers 102.

In some embodiments, the feedback refining process may cause to update the at least some parameters 136D of the probabilistic estimation model 126A based on an expectation maximization (EM) method to guarantee a monotonic improvement of the updated parameters with respect to the measurement likelihood for each EM iteration, such that intermediate smoothing solutions are discarded. Details of the EM method are further provided, for example, in FIG. 1G.

The updated at least some parameters 136D may be subsequently sent back to the smoothing algorithm that may compute yet another posterior, and the process may be repeated until a desired set of model parameters may be achieved. Once the desired set of model parameters may be achieved, the termination condition may said to be met. Details of the feedback refining process are further provided, for example, in FIGS. 4A, 4B, 4C and 4D. Addition embodiments relating to applications and implementations of updating of the at least some parameters are given in FIGS. 1A, 1B, IC, 6, 7A and 7B.

At step 138, the estimated state trajectory 136B and the updated at least some parameters 136D may be rendered. The processor 128 may be configured to render the estimated state trajectory 136B and the updated at least some parameters 136D over a wired or wireless communication channel. In some embodiments, the estimated state trajectory 136B and the updated at least some parameters 136D may be rendered on a device hosting the navigation application. The rendered estimated state trajectory 136B and the updated at least some parameters 136D may be viewed by a user associated with the device hosting the navigation application. The device may be communicatively coupled with the processor 128 via a communication network.

The communication network may be wired, wireless, or any combination of wired and wireless communication networks, such as cellular, Wi-Fi, internet, local area networks, or the like. In one embodiment, the communication network may include one or more networks such as a data network, a wireless network, a telephone network, or any combination thereof. It is contemplated that the data network may be any local area network (LAN), metropolitan area network (MAN), wide area network (WAN), a public data network (e.g., the Internet), short range wireless network, or any other suitable packet-switched network, such as a commercially owned, proprietary packet-switched network, e.g., a proprietary cable or fiber-optic network, and the like, or any combination thereof. In addition, the wireless network may be, for example, a cellular network and may employ various technologies including enhanced data rates for global evolution (EDGE), general packet radio service (GPRS), global system for mobile communications (GSM), Internet protocol multimedia subsystem (IMS), universal mobile telecommunications system (UMTS), etc., as well as any other suitable wireless medium, e.g., worldwide interoperability for microwave access (WiMAX), Long Term Evolution (LTE) networks (for e.g. LTE-Advanced Pro), 5G New Radio networks, ITU-IMT 2020 networks, code division multiple access (CDMA), wideband code division multiple access (WCDMA), wireless fidelity (Wi-Fi), wireless LAN (WLAN), Bluetooth, Internet Protocol (IP) data casting, satellite, mobile ad-hoc network (MANET), and the like, or any combination thereof.

Figure 1E:
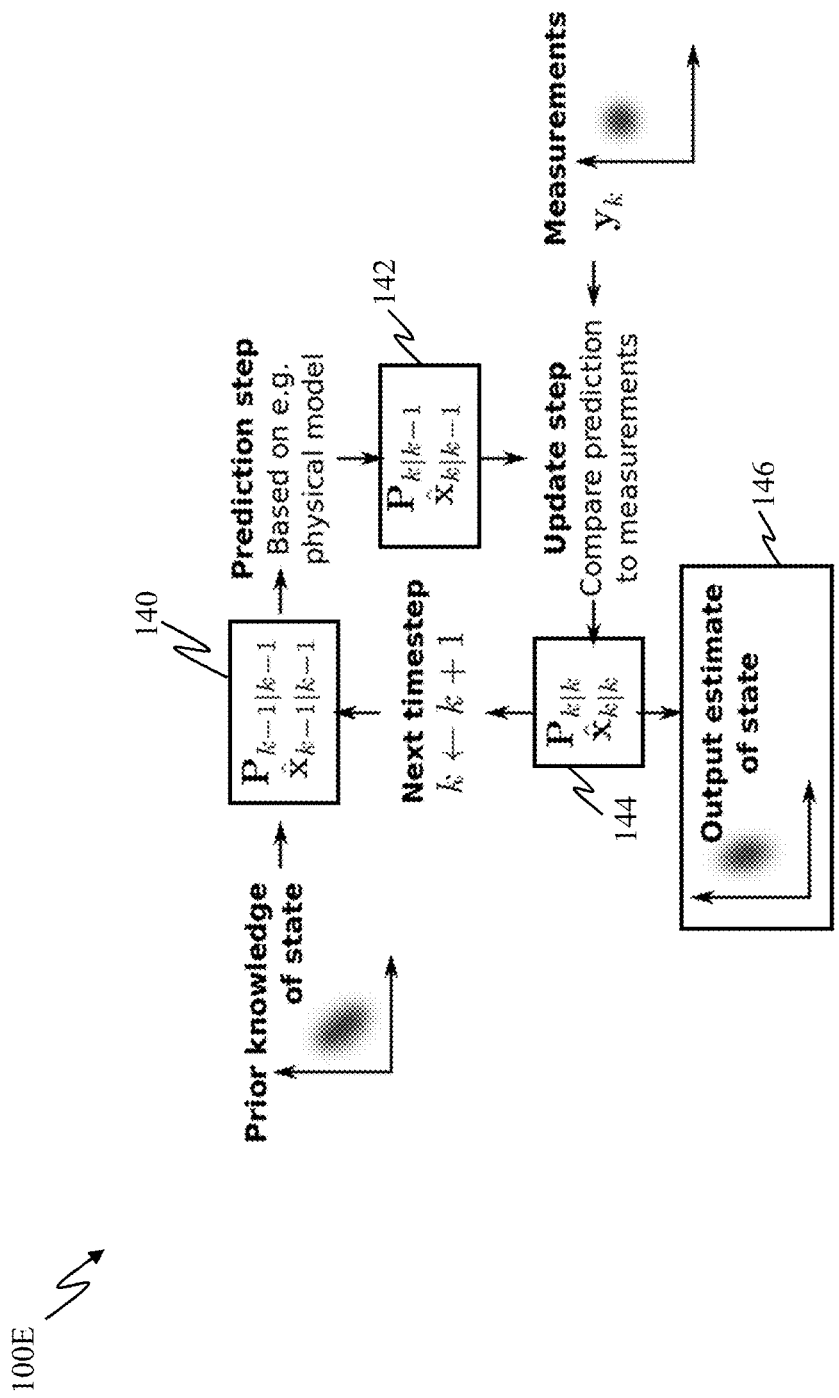
FIG. 1E shows a schematic diagram of a Kalman filter, according to an embodiment of the present disclosure.

FIG. 1E shows a schematic diagram 100E of a Kalman filter, according to an embodiment of the present disclosure. FIG. 1E is explained in conjunction with elements of FIG. 1A, FIG. 1B, FIG. 1C and FIG. 1D. The Kalman filter is a tool for state estimation in linear state-space models. The Kalman filter may be described as follows:

$$x_{k+1} = A_k x_k + q_k \qquad \text{Eq. 1}$$

$$q_k \sim N(0, Q_k) \qquad \text{Eq. 2}$$

$$y_k = C_k x_k + r_k \qquad \text{Eq. 3}$$

$$r_k \sim N(0, R_k) \qquad \text{Eq. 4}$$

where "x" is the state, "k" is time, "N" is Gaussian density, "y" are the measurements and "$Q_k$" and "$R_k$" are covariance.

The Kalman filter is the optimal estimator when the dynamics is linear and the noises are Gaussian distributed, in which case the posterior estimate of the state trajectory is Gaussian distributed. The Kalman filter may be utilized to estimate a mean and a variance of the Gaussian distribution as the mean and the variance are two required quantities, sufficient statistics, to describe the Gaussian distribution.

The schematic diagram 100E depicts steps performed by the Kalman filter. At step 140, the Kalman filter receives information of the initial state distribution of the receiver, such as the receiver 102A. The Kalman filter utilizes the information of the initial state to determine the mean of the state and the variance of the state. At step 142, the Kalman filter predicts the state and the variance at a next time step using a model of the GNSS system, to obtain an updated mean and variance of the state. At step 144, the Kalman filter receives the set of measurements from the receiver 102A. The Kalman filter compares the set of measurements to the obtained updated mean and variance of the state using the measurement model (or a probabilistic estimation model) of the GNSS system to determine an updated mean and variance 141d of the state. At step 146, the Kalman filter outputs the estimated mean and variance of the state based on the comparison. For each time step, the process may be repeated.

The updated equations of the linear Kalman filter given the above probabilistic estimation model 126A is as follows:

$$m_{k|k-1} = A_{k-1} m_{k-1} \qquad \text{Eq. 5}$$

$$\sum\nolimits_{k|k-1} = A_{k-1} \sum\nolimits_{k-1} A_{k-1}^T + Q_{k-1} \qquad \text{Eq. 6}$$

$$K_k = \Sigma_{k|k-1} C_k^T \left( C_k \sum\nolimits_{k|k-1} C_k^T + R_k \right)^{-1} \qquad \text{Eq. 7}$$

$$m_k = m_{k|k-1} + K_k (y_k - m_{k|k-1}) \qquad \text{Eq. 8}$$

$$\Sigma_k = (I - K_k C_k) \overline{\sum\nolimits_{k|k-1}} \qquad \text{Eq. 9}$$

where "m" denotes mean, "Σ" denotes covariance, and where the filter posterior (p) at a time k is $$p(x_k \mid y_{0:k}) = N\!\left(x_k; m_k, \sum\nolimits_k\right) \qquad \text{Eq. 10}$$

In general, the GNSS may utilize multiple constellations in the set of GNSS satellites 106 at the same time to determine the states of the plurality of receivers 102. For example, GPS, Galileo, Glonass, and QZSS may be used concurrently. The GNSS may typically transmit information at up to three different frequency bands, and for each frequency band, each satellite of the set of GNSS satellites 106 transmits the code measurement and the carrier-phase measurement. Such measurements may be combined as either single differenced or double differenced. The single difference may include taking a difference between a reference satellite and other satellites, and double differencing may include differencing also between the receiver of interest and a base receiver or a base station with known static location.

In some embodiments, the processor 128 may utilize a single difference (SD) and/or double difference (DD) of the measured signals, such as the code and carrier phase measurements, for estimating the state of the receiver 102A. In an embodiment, the state may include the position of the receiver 102A. When the signal transmitted from one satellite of the set of GNSS satellites 106 may be received by two receivers, such as the receiver 102A and the receiver 102B, a difference between a first measured signal obtained from the receiver 102A and a measured signal obtained from the receiver 102B is referred as the single difference (SD). Alternatively, the SD may be defined as the difference between measured signals from two satellites reaching the receiver 102A, such that one of the two satellites may be a base satellite. For example, the difference between a measured signal from the satellite 106A and a measured signal from the satellite 106B is one SD signal, where the satellite 106A is the base satellite. Using pairs of receivers, such as the receiver 102A and the receiver 102B, the difference between SDs in measured signals obtained from the radio signals from the two satellites is called the double difference (DD). When the carrier phase difference is converted into a number of wave lengths ($\lambda$), for example, $\lambda_1 \approx 0.1905$ meter for L1 GPS (and/or GNSS) signal, it may be separated by fractional and integer parts. The fractional part may be measured by a positioning apparatus of the GNSS, in case a positioning device of the GNSS may not be able to measure the integer part directly. Thus, the integer part is referred to as integer bias or integer ambiguity.

In other embodiments, it is recognized that combining measurements on different frequency bands may be done in such a way as to eliminate certain biases from the estimation problem. One such example may be ionosphere-free (IF) multi-band (MB) combinations, in which undifferenced, single differenced, or double differenced measurements may be taken in a linear combination over at least two different frequency bands of the carrier frequencies, using a fraction of each proportional to a ratio of the carrier frequencies squared. It is recognized that this, if done appropriately, may eliminate the ionospheric delays from the estimation problem of the states of the plurality of receivers 102.

Figure 1F:
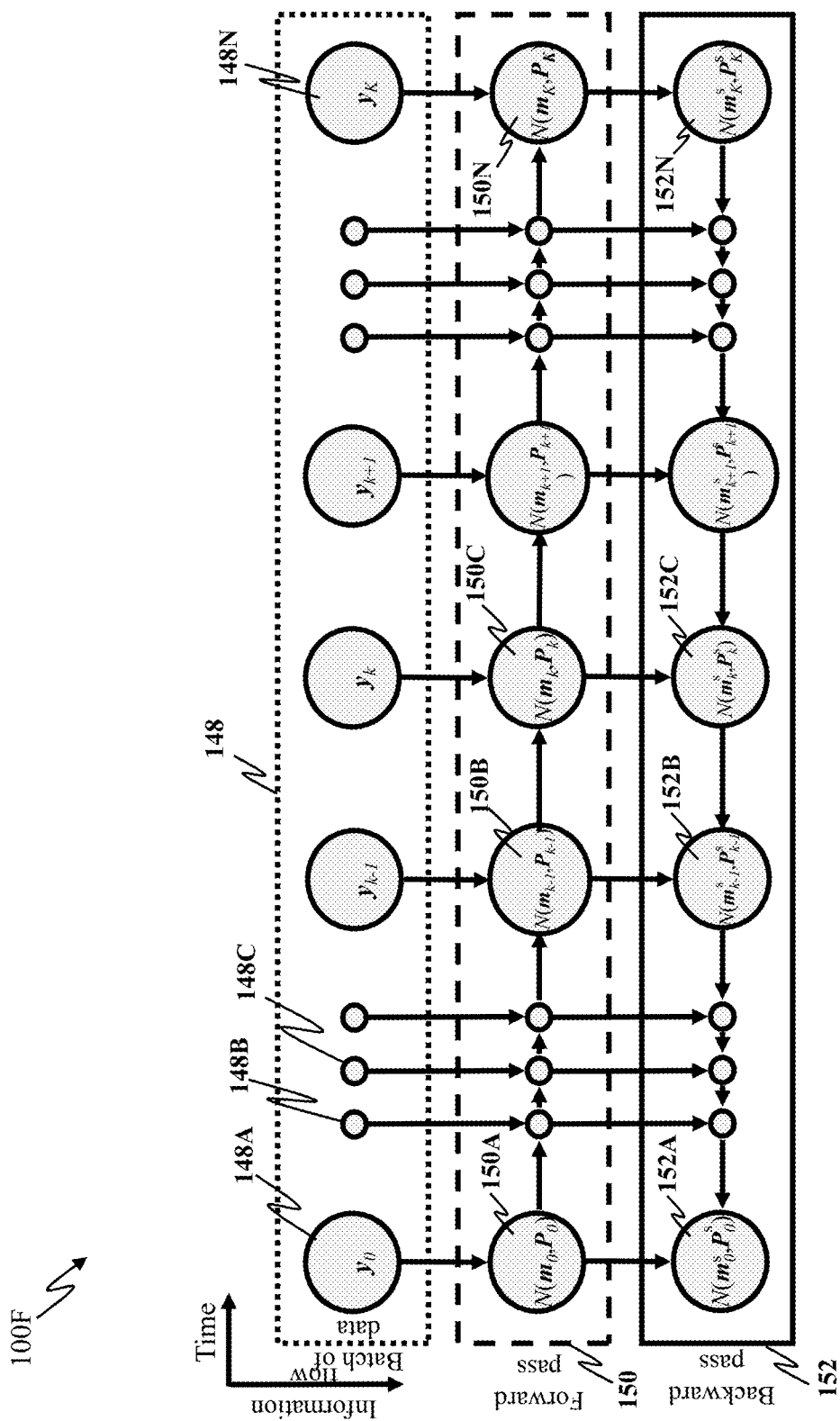
FIG. 1F shows a schematic diagram that depicts flow of information in the Kalman filter and Kalman smoother, according to an embodiment of the present disclosure.

FIG. 1F shows a schematic diagram 100F depicts flow of information in the Kalman filter and Kalman smoother, according to an embodiment of the present disclosure. FIG. 1F is explained in conjunction with elements of FIG. 1A, FIG. 1B, FIG. 1C, FIG. 1D and FIG. 1E. The schematic diagram 100F shows the flow of information in the Kalman smoother run on a batch of data 148 containing several measurements. The Kalman smoother utilizes a forward pass algorithm 150 which is the same as a Kalman filter, but then complements this with a backward pass algorithm 152.

The batch of data 148 may include several measurements 148A, 148B, 148C, . . . 148N, collectively referred as the measurements 148A-148N. For example, the batch of data 148 may include the set of measurements. The forward pass algorithm 150 shows the batch of data 148 being processed to form filtered posterior states measurements 150A, 150B, 150C, . . . 150N, collectively referred as the filtered posterior states measurements 150A-150N. In the backward pass algorithm 152, the filtered posterior states measurements 150A-150N may be corrected by future measurements in the batch to generate smoothing posterior states measurements 152A, 152B, 152C, . . . 152N, collectively referred as the smoothing posterior states measurements 152A-152N.

It is recognized that such a process generates informative and accurate estimates in the linear Gaussian setting. In some embodiments, the processor 128 may be configured to perform the smoothing process using an approximate Gaussian fixed-interval smoother. The Gaussian fixed-interval smoother may include at least one of Rauch-Tung-Striebel (RTS) smoother, Fraser-Potter (FP) smoother, or factor graph optimization smoother. The smoothing process may be performed using at least one of explicit, or statistical linearization methods to resolve nonlinearities of the probabilistic estimation model. Implementing such a Kalman smoother as described in FIG. 1F may be done by use of the RTS smoother, signified by the forward pass algorithm 150 stored in the memory 130 and corrected by the backward pass algorithm 152. It is recognized that there are alternative smoothing schemes, such as the FP smoothers, which runs the forward pass algorithm 150 and the backward pass algorithm 152 in parallel, storing both in the memory 130, before subsequently combining the two estimates into a third estimate which constitutes the smoothing posterior. It is recognized that both the RTS and the FP smoothers produce identical results in the linear Gaussian setting, and some embodiments use either the RTS smoothers, or the FP smoothers, or both. In the case of the backward pass algorithm 152 of the RTS, the correction equations are describes as follows:

$$G_k^S = \sum_k A_k^T \left( \sum_{k|k-1} \right)^{-1} \qquad \text{Eq. 11}$$

$$m_k^S = m_k + G_k^S (m_{k+1}^S - m_{k|k-1}) \qquad \text{Eq. 12}$$

$$\sum_k^S = \sum_k + G_k^S \left( \sum_{k+1}^S - \sum_{k|k-1} \right) (G_k^S)^T \qquad \text{Eq. 13}$$

where the smoothing posterior at a time k is described as follows:

$$p(x_k | y_{0:K}) = N\left(x_k; m_k^S, \sum_k^S\right) \qquad \text{Eq. 14}$$

It is recognized that some relationships in the probabilistic estimation model, such as geometric ranges, are nonlinear functions of the state (e.g., position, velocity, biases) of the receiver 102A. In such a case, the probabilistic estimation model 126A or the measurement model may be nonlinear, and may be modeled as:

$$y_k = h_k(x_k) + r_k = g_k(x_k) + C_k x_k + r_k \qquad \text{Eq. 15}$$

where h is a nonlinear function. In such a case, some embodiments may leverage first order approximations of the nonlinearities to generate locally linear models that may be used in the RTS or FP smoothing frameworks, while other embodiments may use partially linear moment matching techniques to approximate the distribution of a random variable passed through a partially linear function. For example, in case of the partially linear moment matching techniques, the integrals may be represented as:

$$m_{k|k-1}^y = \int h(x_k) N\left(x_k; m_{k|k-1}, \sum_{k|k-1}\right) dx_k \quad \text{Eq. 16}$$

$$\sum_{k|k-1}^{xy} = \int [x_k - m_{k|k-1}][g(x_k) - m_{k|k-1}^y]^T N\left(x_k; m_{k|k-1}, \sum_{k|k-1}\right) dx_k \quad \text{Eq. 17}$$

$$\sum_{k|k-1}^{yy} = \quad \text{Eq. 18}$$

$$\int [h(x_k) - m_{k|k-1}^y][h(x_k) - m_{k|k-1}^y]^T N\left(x_k; m_{k|k-1}, \sum_{k|k-1}\right) dx_k + R_k$$

The integrals may be evaluated by means of cubature rules, over the part of the probabilistic estimation model 126A (or the measurement model) that may be nonlinear in the states of the estimation model. The integrals may be updated as follows in the computations of the filtering posterior:

$$K_k = \sum_{k|k-1}^{xy} \left(\sum_{k|k-1}^{yy}\right)^{-1} \quad \text{Eq. 19}$$

$$m_k = m_{k|k-1} + K_k\left(y_k - m_{k|k-1}^y\right) \quad \text{Eq. 20}$$

$$\sum_k = \sum_{k|k-1} - K_k\left(\sum_{k|k-1}^{yy}\right)^T \quad \text{Eq. 21}$$

It is recognized that for the linear prediction models, the smoothing corrections remain the same as in the linear setting and may not require computationally costly evaluations of moment integrals.

In some embodiments, the prediction model may be taken to be linear or nonlinear, with some states configured on the real numbers, and others, specifically biases relating to the integer ambiguities configured on the integers. In such a case, the noise driving the prediction model such as the probabilistic estimation model 126A may be partitioned into gaussian noise "q" for the real-valued states, and integer jump noise "s" for the integer valued states. The updated states are represented as:

$$x_{k+1} = A_k x_k + B_k^{\mathbb{R}} q_k + B_k^{\mathbb{Z}} s_k \quad \text{Eq. 22}$$

$$y_k = h_k(x_k) + r_k = g_k(x_k) + C_k x_k + r_k \quad \text{Eq. 23}$$

For example, two different models may be defined. The first may be a relaxed estimation model, in which the biases related to the ambiguities may be permitted to take values on the real numbers (hence relaxed). The other model may be a fixed estimation model, where specific fixed ambiguity biases are assumed, and the number of states "x" in the estimation model may be reduced to only contain the real-valued states. In the adaptive post processing algorithm, it is recognized that solutions need to be computed for each of these models. The relaxed model to find the integer ambiguities, and the fixed model to compute the receiver positioning estimates given these integer biases.

In the estimation model, which may include undifferenced, the SD, the DD and the IF combinations of measurement residuals, and motion models including constant position, constant velocity, singer motion models, and other more specific vehicular motion models, the model parameters may not be perfectly known. For instance, in FIG. 2B, the noise levels for the measurements may not be perfectly known, and in FIG. 2C, the parameters of the motion model, and specifically the noise levels of the process noise may not be perfectly known. For example, in the latter case, the noise covariance may be made parameter dependent, with the following equation:

$$p(q_k, r_k, s_k) = N(q_k; 0, Q_k^{\mathbb{R}}(\theta)) N(r_k; 0, R_k) J(s_k; a1, b1) \quad \text{Eq. 24}$$

With such an equation, positioning performance may improve if there is a systematic and safe way of choosing the parameters θ in a data driven manner.

There are many ways of estimating such parameters, and one method is expectation maximization (EM), where the negative log likelihood of the measurements given the model parameters is minimized. However, the computation of this measurement likelihood may be costly, and it is recognized that for the high-dimensional estimation problems relating to the GNSS positioning, a direct minimization of the negative log-likelihood is both infeasible computationally, and potentially unsafe as there is not prior way of telling exactly how the estimates will behave after updating the model parameters.

Figure 1G:
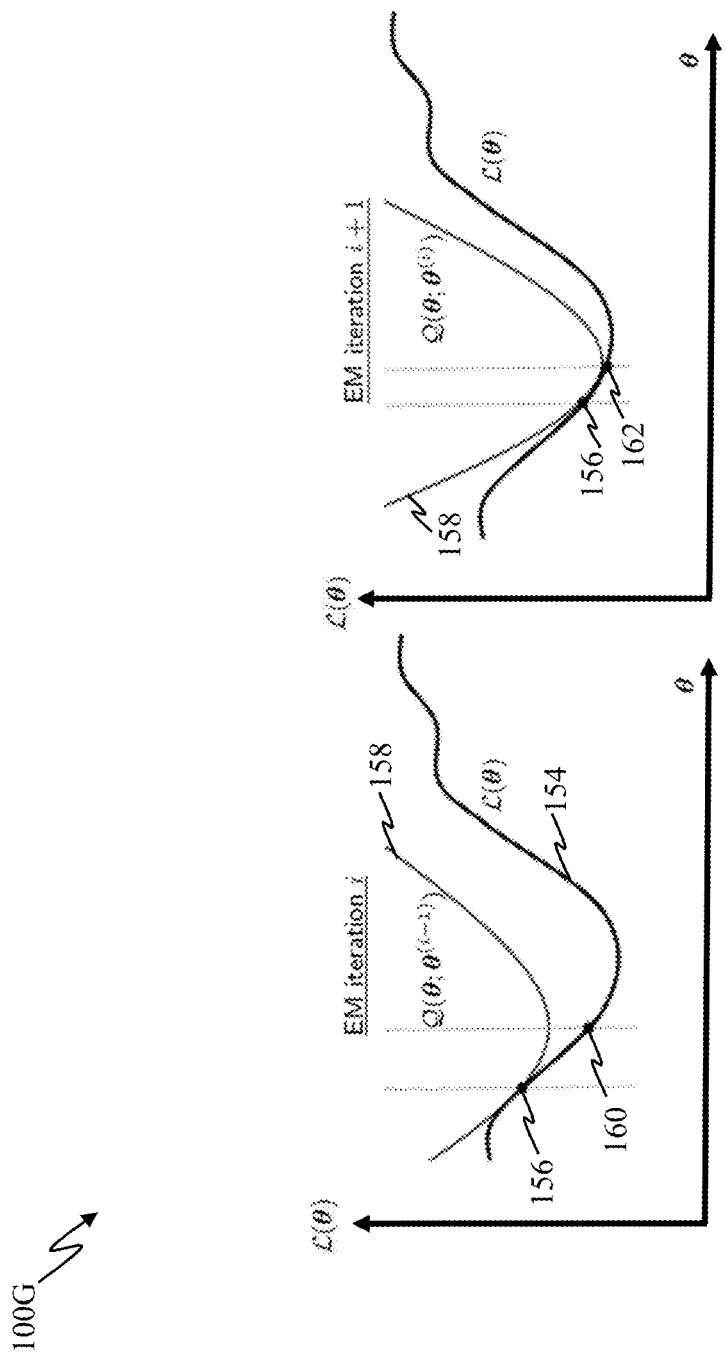
FIG. 1G illustrates a diagram that depicts core ideas of expectation maximization, according to an embodiment of the present disclosure.

FIG. 1G illustrates a diagram 100G that depicts core ideas of the EM, according to an embodiment of the present disclosure. FIG. 1G is explained in conjunction with elements of FIG. 1A, FIG. 1B, FIG. 1C, FIG. 1D, FIG. 1E and FIG. 1F. The diagram 100G depicts graphs for ith iteration and (i+1)th iteration of the EM with respect to the parameter θ.

The diagram 100G depicts the code idea of the EM, that may remedy both the point of computational complexity and safety in the context of linear Gaussian estimation models. The EM may express an upper bound on a negative log likelihood 154 at a point in a parameter space 156 where a smoothing posterior has been computed. It is understood that the computation of a so-called Q-function 158 may be faster than computing an entire smoothing posterior, and that its evaluation is much faster than evaluating the negative log likelihood at a single point in the estimation model's parameter space 156. Indeed, it is recognized that it may be possible to minimize the Q-function analytically in the context of linear Gaussian models.

This is further illustrated in FIG. 1G, where the Q-function 158 admits a global minima 160 that may be known analytically from the shape of the Q-function 158 and may be computed on a single EM iteration. On the next (i+1)th iteration, a new smoothing posterior is computed about a new point in the parameter space 156, and this is subsequently minimized yielding a new parameter 162 that may be passed on to the next EM iteration. It is recognized that such a procedure gives guarantees on a decay in the Q-function 158 over the EM iterations, in the sense that the Q-function 158 evaluated at the parameters in the next iteration ((i+1)th) is lower than the previous Q-function evaluated in the parameters of the previous iteration (such as ith), and guarantees improvements in the parameter estimates, rendering the algorithm safe to use in a linear Gaussian setting.

In one or more embodiments, variants of the RTS smoother, including but not limited to explicit linearization and partially linear moment matching, combined with parameters adaption, that in some embodiments may be done using the EM method, as applied to both the relaxed and fixed estimation models in specific orders. The estimation model either explicitly or implicitly models the dynamics of the integer valued biases, constitutes the adaptive post processing method.

Figure 2A:
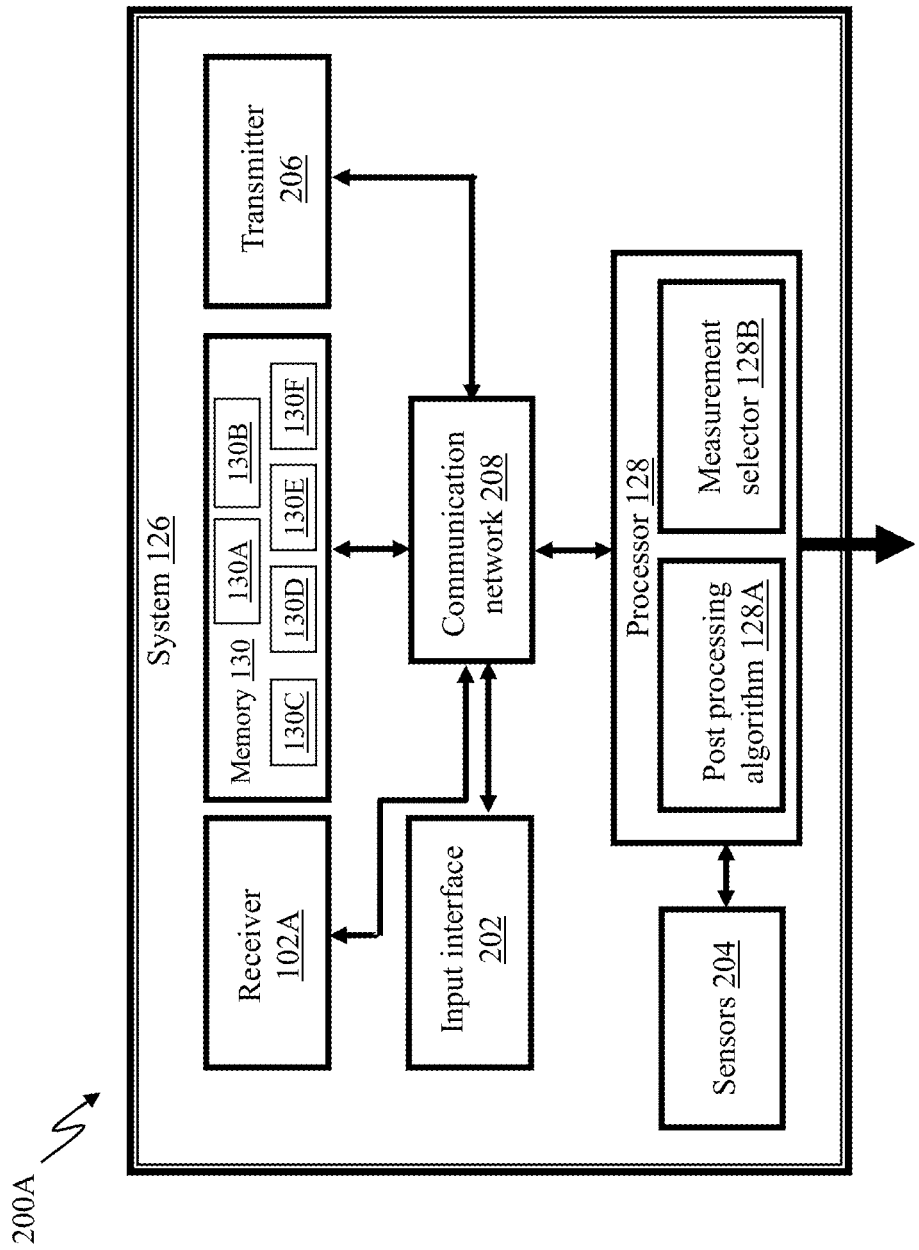
FIG. 2A shows a block diagram of the system for tracking a state of the plurality of receivers, according to an embodiment of the present disclosure.

FIG. 2A shows a block diagram 200A of the system 126 for tracking the state of the plurality of receivers 102, according to an embodiment of the present disclosure. FIG. 2A is explained in conjunction with elements of FIG. 1A, FIG. 1B, FIG. 1C, FIG. 1D, FIG. 1E, FIG. 1F and FIG. 1G. The block diagram 200A may include the processor 128, the memory 130, the receiver 102A, an input interface 202, sensors 204, a transmitter 206 and a communication interface 208.

The system 126 may be for example, the state estimation system that may include the input interface 202 to accept the set of measurements indicative of a change of the state of the receiver, such as the receiver 102A and measurements of satellite signals, i.e., the carrier signals and the code signals transmitted from the set of GNSS satellites 106. Each carrier signal may include a carrier phase ambiguity as an unknown integer number of wavelengths of the carrier signal travelled between the satellite such as the satellite 106A and the receiver 102A. The measurement for each satellite signal may include the single difference between the satellite signal transmitted by a satellite of the set of GNSS satellites 106 and another satellite signal to include a relative position of the receiver 102A of the satellite signal with respect to a position of the satellite subject to integer ambiguity of the carrier signal of the satellite and noise, such that all possible measurements for each satellite signal form the set of measurements. The system 126 may be implemented internally on several devices on which the receiver 102A is located, such as handheld devices, cars, airplanes, or trains. Additionally, or alternatively, the system 126 may be communicatively connected to the device, i.e., the receiver 102A may not be physically inside the system. Additional details of the system 126 are further provided, for example, in FIG. 1D.

The system 126 also includes the memory 130 storing a motion model 130A relating a previous state of the receiver 102A to a current state of the receiver 102A. The motion model may be subject to process noise. The memory 130 may also store a measurement model 130B that relates the measurements of the carrier and code signals received by the receiver 102A to the current state of the receiver 102A using the carrier phase ambiguities of the carrier signals. The measurement model 130B relates a subset of the measurements of satellite signals to the current state of the receiver 102A, such that a maximum size of the subset of measurements is predetermined and fixed. The measurement model 130B may be a probabilistic model subject to measurement noise. Due to the inherent random noise and errors of the satellite transmitter and receiver 102A, the motion model 130A and the measurement model 130B are probabilistic, thus allowing several possible values of the carrier phase ambiguity at any given epoch to be consistent with those models with different probabilities.

The memory 130 may also store a set of possible combinations of integer values 130C, the smoothing algorithm 130D described by other embodiments. The memory 130 may further store carrier phase measurements 130E, as well as data provided by the sensors 204. For example, in some implementations, the memory 130 stores a geometry 130F of the physical construction on which the receiver 102A is mounted, and a geometrical relationship between the set of GNSS satellites 106 and the plurality of receivers 102. While illustrated in FIG. 2A as being separate from the processors 128, all or part of a primary memory 130 may be provided within or otherwise co-located and/or coupled to the processors 128. Additional details of the memory 130 are further provided, for example, in FIG. 1D.

The system 126 may include the additional sensors 204 that may help in aiding the positioning system. For instance, the sensors 204 may include an inertial measurement unit (IMU), a camera, wheel encoders if mounted in a wheeled vehicle, one or more laser ranging sensors, radar sensors and barometers. For example, when connected to a car, the IMU and wheel encoders may be used in a motion model of the vehicle to increase accuracy of the positioning system beyond a certain limit.

The IMU may include 3-axis accelerometer(s), 3-axis gyroscope(s), and/or magnetometer(s). The IMU may provide velocity, orientation, and/or other position related information to the processor 128. In some embodiments, the IMU may output measured information in synchronization with the capture of each image frame from a camera. In some embodiments, the output of the IMU is used in part by the processor 128 to fuse the sensor measurements and/or to further process the fused measurements.

The system 126 includes the processor 128 for tracking the state of the receiver 102A using the smoothing algorithm 130D stored in the memory 130. The processor 128 may further include a post processing algorithm 128A and a measurement selector 128B. Further, the processor 128 may be configured to utilize the measurement selector 128B to select a subset of measurements with respect to the set of measurements using masking methods or other measurement selection approaches. Also, the processor 128 may be configured to utilize the post processing algorithm 128A to execute and/or run at least one state estimator determining states of the receiver 102A by jointly using the motion model 130A and the measurement model 130B. Each state estimator determines a joint probability distribution of the state of the receiver 102A with respect to the motion model 130A and the measurement model 130B and may be executed by the processor 128 concurrently and/or sequentially.

The system 126 may further include the transmitter 206 that may be configured to transmit one or more signals. For instance, the transmitter 206 may send the state of the receiver 102A to other estimation methods, to be used in fusion with other sensors to improve accuracy. The receiver 102A and the transmitter 206 may receive and transmit over one or more types of wireless communication networks, such as the communication network 208.

The communication network 208 may be wired, wireless, or any combination of wired and wireless communication networks, such as cellular, Wi-Fi, internet, local area networks, or the like. In one embodiment, the communication network 208 may include one or more networks such as a data network, a wireless network, a telephone network, or any combination thereof. It is contemplated that the data network may be any local area network (LAN), metropolitan area network (MAN), wide area network (WAN), a public data network (e.g., the Internet), short range wireless network, or any other suitable packet-switched network, such as a commercially owned, proprietary packet-switched network, e.g., a proprietary cable or fiber-optic network, and the like, or any combination thereof. In addition, the wireless network may be, for example, a cellular network and may employ various technologies including enhanced data rates for global evolution (EDGE), general packet radio service (GPRS), global system for mobile communications (GSM), Internet protocol multimedia subsystem (IMS), universal mobile telecommunications system (UMTS), etc., as well as any other suitable wireless medium, e.g., worldwide interoperability for microwave access (WiMAX), Long Term Evolution (LTE) networks (for e.g. LTE-Advanced Pro), 5G New Radio networks, ITU-IMT 2020 networks, code division multiple access (CDMA), wideband code division multiple access (WCDMA), wireless fidelity (Wi-Fi), wireless LAN (WLAN), Bluetooth, Internet Protocol (IP) data casting, satellite, mobile ad-hoc network (MANET), and the like, or any combination thereof.

Figure 2B:
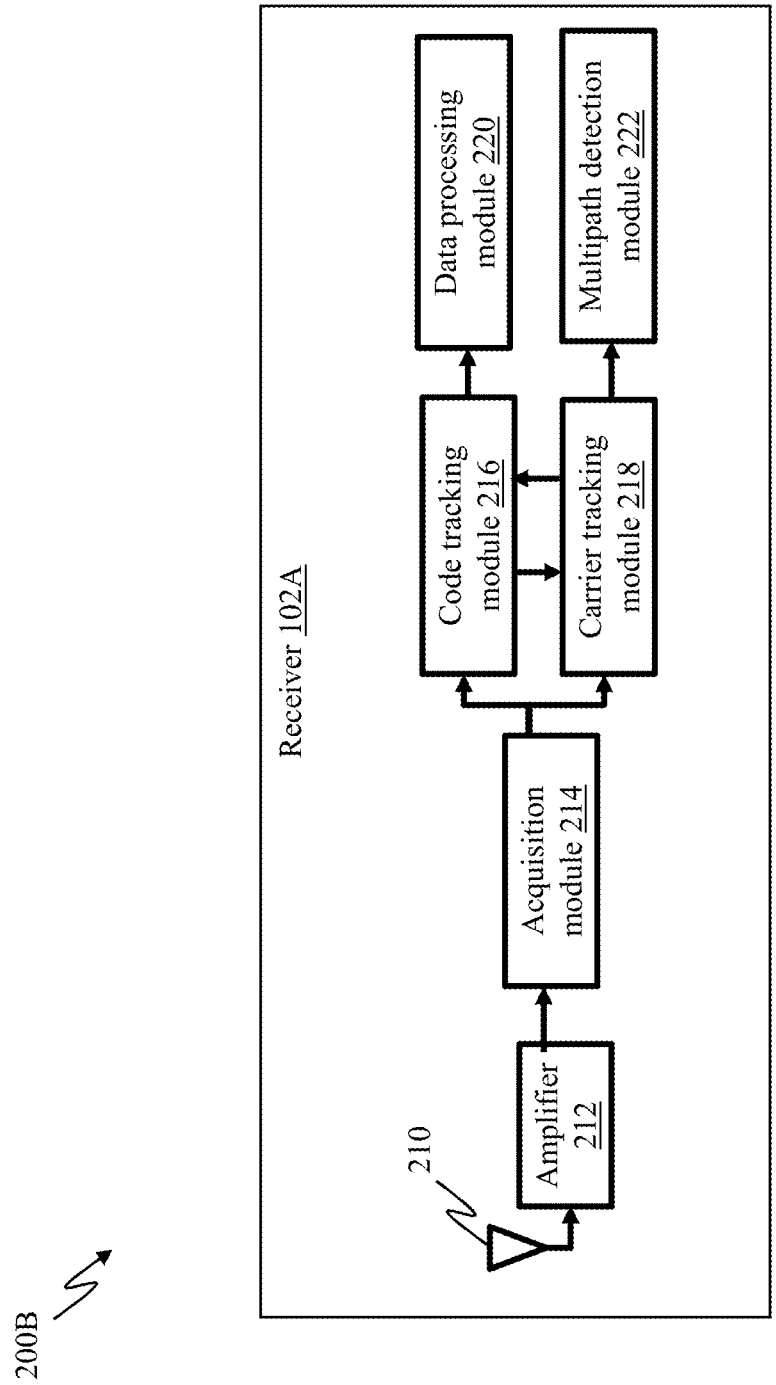
FIG. 2B shows a block diagram of a receiver of the plurality of receivers, according to an embodiment of the present disclosure.

FIG. 2B shows a block diagram 200B of the receiver 102A of the plurality of receivers 102, according to an embodiment of the present disclosure. FIG. 2B is explained in conjunction with elements of FIG. 1A, FIG. 1B, FIG. 1C, FIG. 1D, FIG. 1E, FIG. 1F, FIG. 1G and FIG. 2A. The receiver 102A may include an antenna 210, an amplifier 212, an acquisition module 214, a code tracking module 216, a carrier tracking module 218, a data processing module 220 and a multipath detection module 222.

In some embodiments, the multipath detection module 222 may be configured to perform the measurements to detect the presence of multipath. The measurements may be computed natively in the receiver 102A as part of the process by which the position is estimated. The received signal from the antenna 210 is made up of the sum of the signals emitted by each satellite of the set of GNSS satellites 106. The amplifier 212 may be configured to strengthen the signal for further processing. The acquisition module 214 may be configured to initialize the tracking process by supplying estimates for the phase and frequency of each received satellite signal. A tracking unit comprising the code tracking module 216 and the carrier tracking module 218 may be configured to estimate and provide measurements of phase and frequency of each satellite signal over time. For example, the code tracking module 216 may estimate the phase and frequency of the code observable. The carrier tracking module 218 may estimate the phase and frequency of the carrier wave of the satellite signal. The data processing module 220 may be configured to process the data from the code tracking module 216. The multipath detection module 222 may be configured to process the data from the carrier tracking module 218.

In an embodiment, the receiver 102A may have several antennae 210, but combinations of several antennae with as many receivers are conceivable. One embodiment uses multiple antennae with as many receivers as antennae. The antennae are spatially separated, which allows the receivers to detect differences between the observed carrier frequencies on the same satellite signal.

Figure 3A:
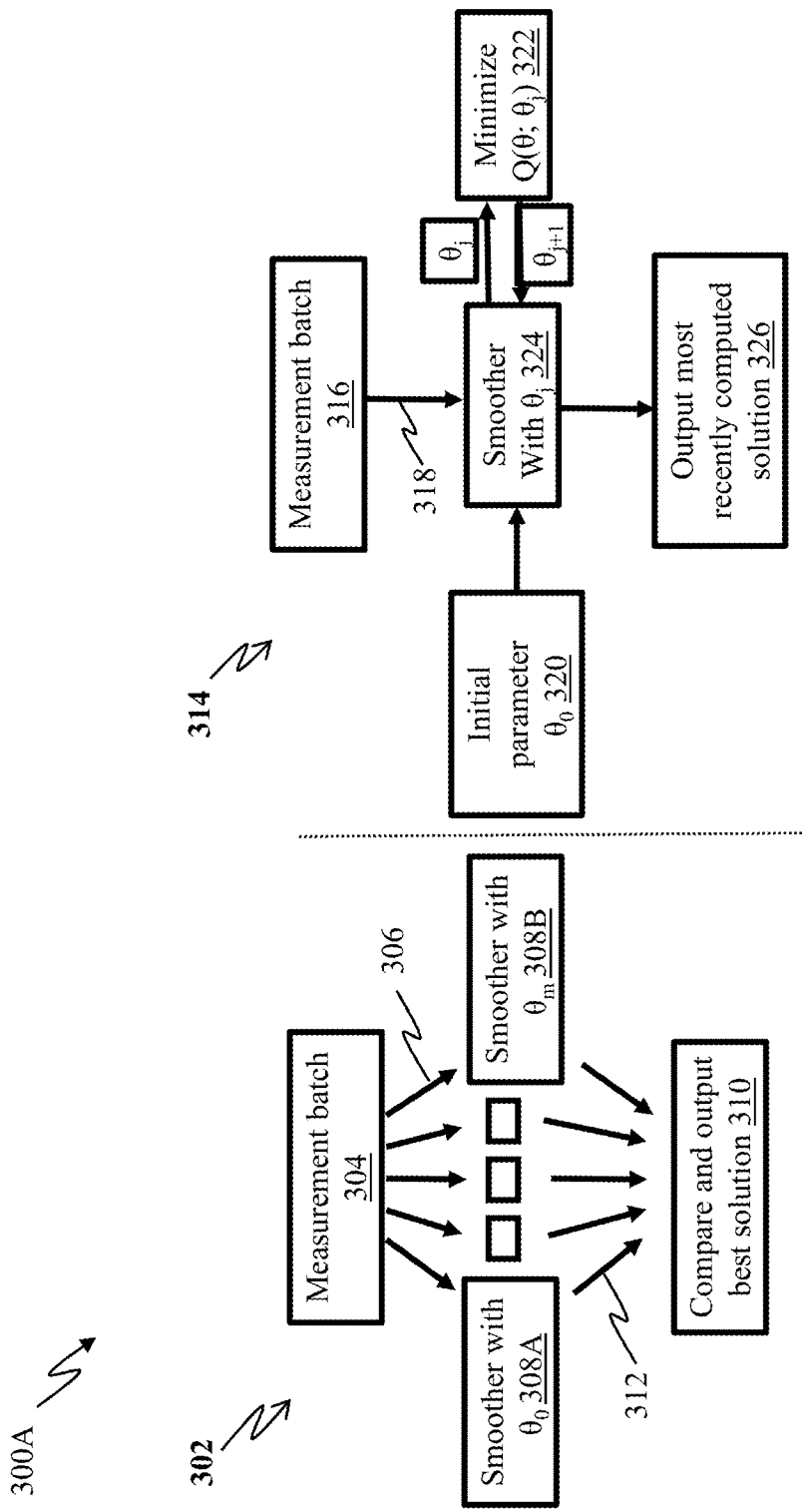
FIG. 3A shows a diagram depicting a high-level description of a method of processing a satellite signal and comparison with other types of post processing methods, according to an embodiment of the present disclosure.

FIG. 3A shows a diagram 300A depicting a high-level description of a method of processing a satellite signal and comparison with other types of post processing methods, according to an embodiment of the present disclosure. FIG. 3A is explained in conjunction with elements of FIG. 1A, FIG. 1B, FIG. 1C, FIG. 1D, FIG. 1E, FIG. 1F, FIG. 1G, FIG. 2A and FIG. 2B.

A block diagram 302 of the diagram 300A depicts steps in which state of the art post processing for the GNSS is implemented. A batch of measurement data 304 consisting of individual measurements 306 may be processed by one or more smoothers, such as a smoother 308A and a smoother 308B with fixed parameters. For example, the batch of measurement data 304 may include the set of measurements. Here, the parameters relating to the prediction model and measurement model may be varied slightly among the smoothers. At a step 310, a best performing smoother or a desired smoother may be selected from the smoother 308A and the smoother 308B based on some measure indicative of the estimation performance. Such a measure may be chosen as a mean-square error of the estimates indicated by covariance matrices in a smoothing posterior 312, or a certainty with which the integer ambiguities may be fixed, or other signals indicative of estimation accuracy. However, a ground truth may not be available, and the best solution (or the best performing smoother) needs to be chosen based on the signals that may indicate estimation performance, but that may not be necessarily correct.

A block diagram 314 of the diagram 300A depicts a method according to an embodiment of the present disclosure that is distinctly different to the conventional approach in the way in which the model parameters are chosen, and the best model (or the best performing smoother) may be selected. A batch of measurement data 316 consisting of individual measurements 318 may be processed by a smoother. For example, the batch of measurement data 316 may include the set of measurements. The smoother may be operating based on an estimation model parametrized in a set of initial parameters $\theta_0$ 320 that may be an initial guess of the parameters provided as input to the smoothing algorithm. The smoothing algorithm subsequently computes a smoothing posterior, that may be used to construct a majorizing Q-function of the negative log likelihood of the measurements given the model parameters. At step 322, such a Q-function is subsequently minimized, yielding a new set of parameters that may be returned to the smoother. Further, a new smoothing solution is computed in a smoother 324, and the procedure may be repeated until a user requests a solution whereupon the most recently computed solution may be provided to the user. An output 326 that includes the most recently computed solution may be provided to the user.

It is recognized that based on the theory of EM for linear Gaussian systems, the solution (such as the output 326) reported to the user may be the solution with lowest negative log likelihood of any solution computed until that point. This is possible to state without ever computing the ground truth and makes the feedback mechanism of the parameter adaptation in the manner outlined in FIG. 3A safe. As such, it is recognized that only the most recently computed smoothing posterior needs to be stored in the solutions computed in the intermediary steps can immediately be discarded.

It is recognized that with apt choices of parameters in the estimation model, the EM typically converges in a small number of iterations. In contrast to this adaptive post processing, an extremely high number of parameter combinations need to be tested when implementing the parameter selection without a feedback mechanism like the EM, and for each combination of parameters a smoothing solution needs to be computed. Thus, it is recognized that the EM not only provides a safe feedback mechanism in the context of GNSS post processing, but that it may be significantly more efficient from a computational standpoint.

It is also recognized that to make the adaptation safe, it is critical that the parameters of the relaxed estimation model are adapted, and that the parameter dependence in the estimation model does not change functionally over the EM iterations. As such, the adaptive post processing algorithm consists of three main steps. An adaptive RTS smoother on the relaxed estimation model, where the cycle slip detection is used to fix the parameter dependence in the estimation model on the first iteration. This is followed by a sequence of EM iterations to refine the estimation model's free parameters $\theta_0$. Thirdly, once a suitable set of parameters has been found or the user requests an output, the integer biases are fixed based on the most recently computed smoothing or filtering posterior. Once fixing the integer ambiguities, resulting in a fixed estimation model. A smoothing pass is then done based on the fixed integer estimation model, and the output is reported to the user.

Figure 3B:
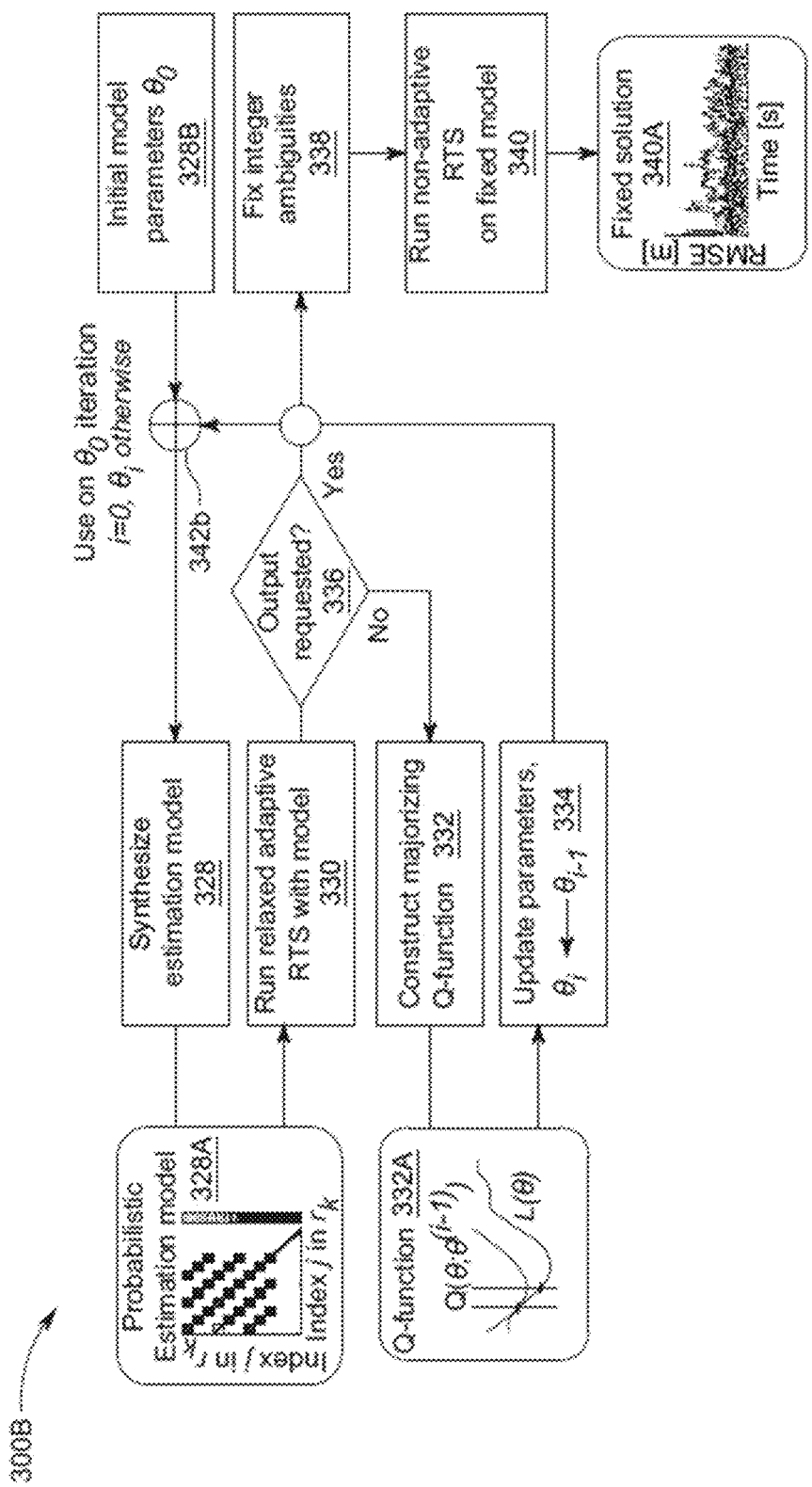
FIG. 3B shows a diagram depicting a high-level description of an adaptive post processing method, including smoothing algorithms numerical optimization and integer fixation, according to an embodiment of the present disclosure.

FIG. 3B shows a diagram 300B depicting a high-level description of an adaptive post processing method, including smoothing algorithms numerical optimization and integer fixation, according to an embodiment of the present disclosure. FIG. 3B is explained in conjunction with elements of FIG. 1A, FIG. 1B, FIG. 1C, FIG. 1D, FIG. 1E, FIG. 1F, FIG. 1G, FIG. 2A, FIG. 2B and FIG. 3A. The diagram 300B shows steps for performing the adaptive post processing method. The diagram 300B shows how flow of information in the adaptive post processing algorithm is performed.

At step 328, a relaxed estimation is synthesized. In some embodiments, the processor 128 may be configured to perform the synthesis of the relaxed estimation. For example, based on available measurements and specifications from the user, the relaxed estimation may be synthesized where the integer biases are permitted to be configured on the real numbers. In an embodiment, a probabilistic estimation model 328A may be parametrized in initial model parameters 328B. In an embodiment, the probabilistic estimation model 328A is same as the probabilistic estimation model 126A of FIG. 1D. In an example, the probabilistic estimation model 328A may be same as the measurement model 130B of FIG. 2A.

At step 330, an adaptive RTS smoothing may be performed. In some embodiments, the processor 128 may be configured to perform the adaptive RTS smoothing. The estimation model 328A parametrized in the initial model parameters 328B may be used for the adaptive RTS smoothing. In some embodiments, the adaptive RTS smoother determines cycle slips (for example, sporadic jumps in the integer ambiguities) on the first iteration of the EM algorithm and fixes the bases (or parameter dependence) in the probabilistic estimation model 328A based on the cycle slip detection. An example of such an adaptive method is explained below in relation to the dynamics of the integer ambiguities.

At step 332, a Q-function 332A may be constructed. In some embodiments, the processor 128 may be configured to construct the Q-function 332A. In an embodiment, the processor 128 may construct the objective Q-function 332A for parameter-optimization of the at least some parameters, using the smoothing process of a relaxed estimation problem. The relaxed estimation problem may be a biconvex function that majorizes a negative measurement log-likelihood. Once the smoothing posterior has been computed based on the relaxed estimation model, the Q-function 332A may be constructed such that it majorizes the negative log likelihood of the measurements given the model parameters. In some embodiments, the Q-function 332A may be formed such that arguments of the Q-function 332A are all or some of at least one of parameters relating to maps, such as linear maps and functions of the probabilistic estimation model. In some embodiments, the Q-function 332A may be formed such that the arguments of the Q-function 332A may be a set of parameters parametrizing at least one of one or more of functions and matrices defining a measurement model of the probabilistic estimation model 328A, the inverse covariance matrices, the functions and matrices defining a prediction model of the probabilistic estimation model 328A, the construction of the probabilistic estimation models. For example, the probabilistic estimation model 328A may include two models, such as the measurement model and the prediction model. In case the measurement model and the prediction model are non-linear, the probabilistic estimation model 328A may be considered a non-linear model. In case the measurement model and the prediction model are linear, the probabilistic estimation model 328A may be considered a linear model.

At step 334, the Q-function 332A may be minimized. In some embodiments, the processor 128 may be configured to minimize the Q-function 332A. The Q-function 332A may be subsequently minimized to yield a set of new parameters. The minimization may be performed in several ways. For example, analytical expressions exist in the case of linear gaussian models, even when they are sparse, and the optimization may also be done with regularizers to further promote sparsity and hedge against misspecifications of the parameter dependence in the probabilistic estimation model 328A.

At step 336, the processor 128 may be configured to check if a request for the output is received from the user. For example, in the execution of the algorithm, the user may choose to interrupt execution and obtain the solution. However, in case the request for the output is not received from the user (or execution is not interrupted by the user), and the parameters are sufficiently far away from the local optimal solution minimizing the negative measurement log likelihood, the updated parameters may be used to reparametrize the probabilistic estimation model 328A, and a new RTS smoothing pass may be initiated. In some embodiments, for the subsequent iterations of updated parameters, the parameter dependence determined on the first iteration may be used to make the algorithm execution and the feedback mechanism safe. In other embodiments, the parameter dependence in the estimation model may be tested and revised on each consecutive iteration.

At step 338, in case the request for the output is received from the user, the most likely integer ambiguities may be determined. In some embodiments, the processor 128 may be configured to determine the most likely integer ambiguities. For example, in case the EM iteration terminates due to a convergence criterion, the best smoothing posterior computed until that point may be used to determine the most likely integer ambiguities, commonly referred to as fixing the ambiguities. The ambiguity fixation may be often done on a filtering posterior, but it is recognized that the fixation accuracy may improve if instead fixing may be performed on the smoothing posterior. As such, one embodiment fixes the integer ambiguities based on the smoothing posterior associated with the most likely model parameters given the measurement data.

At step 340, the non-adaptive RTS may be run on the probabilistic estimation model 328A. In some embodiments, the processor 128 may be configured to run the non adaptive RTS on the probabilistic estimation model 328A. Once the integer ambiguities have been fixed, the fixed-integer estimation model, such as the probabilistic estimation model 328A may be synthesized, effectively removing such biases from the state vector. A final smoothing forward algorithm and the backward pass algorithm may be performed based on such ambiguities, resulting in a fixed smoothing posterior over the real-valued states of the mixed-integer estimation model. An output 340A, i.e, the solution along with the trajectory of integer ambiguity hypotheses may be provided or reported to the user.

Figure 3C:
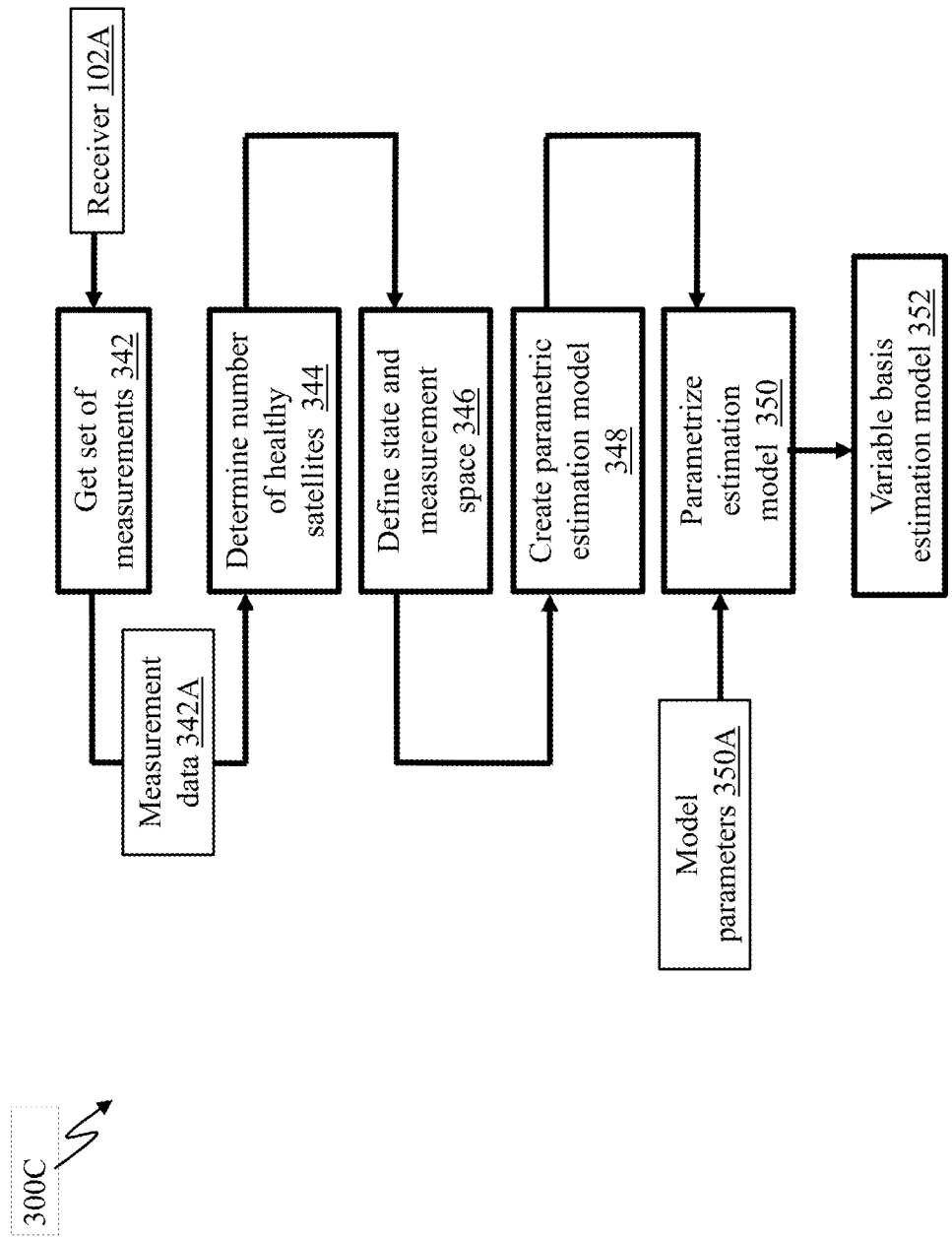
FIG. 3C shows a diagram depicting the synthetization of the probabilistic estimation model, according to an embodiment of the present disclosure.

Further, the measurement modeling and synthesis followed by the cycle slip detection algorithm used in the adaptive smoothing are explained in detail in FIG. 3C. Moreover, the smoothing conducted with respect to the relaxed probabilistic estimation model 328A, the construction and minimization of the Q-function 332A, and the smoothing conducted based on the fixed probabilistic estimation model 328A are further described in FIG. 3C.

FIG. 3C shows a diagram 300C depicting synthetization of the probabilistic estimation model 328A, according to an embodiment of the present disclosure. FIG. 3C is explained in conjunction with elements of FIG. 1A, FIG. 1B, FIG. 1C, FIG. 1D, FIG. 1E, FIG. 1F, FIG. 1G, FIG. 2A, FIG. 2B, FIG. 3A and FIG. 3B. The diagram 300C shows steps for synthetization of the probabilistic estimation model 328A.

At step 342, the set of measurements may be received. In some embodiments, the processor 128 may be configured to receive the set of measurements from the plurality of receivers 102. The synthesis may start by acquiring the set of measurements from one or more of the plurality of receivers 102. In an embodiment, the set of measurements may include signals indicative of pseudo-range, carrier phase and/or Doppler measurements, from multiple GNSS constellation on multiple frequency bands as described in FIG. 1A. The set of measurements may further include other sensory information, as described in FIG. 2A.

At step 344, based on measurement data 342A or the set of measurements, the satellite signals may be flagged as healthy or unhealthy. In some embodiments, the processor 128 may be configured to flag the satellite signals as healthy or unhealthy. The flagging may depend on factors such as carrier-noise density ratios, elevation angles, a geometry of open sky, or more refined estimation algorithms associated with the set of GNSS satellites 106.

At step 346, state and measurement spaces may be defined. In some embodiments, the processor 128 may be configured to define the state and measurement spaces based on the satellite availability. In some embodiments, a union of the healthy and visible satellites across all time steps or epochs in the set of measurements may be used to determine the size of the state and measurement spaces, subject to the selected differencing scheme. For example, the measurement scheme may include undifferenced, SD, DD, and ionosphere-free combinations of the GNSS observables over one or multiple frequency bands as explained in FIG. 1A.

At step 348, the probabilistic estimation model 328A may be created. In some embodiments, the processor 128 may be configured to create the probabilistic estimation model 328A. It is recognized that the choice of the measurement scheme may affect both the definition of the state space and the definition of the measurement space. It is further recognized that the number of states in the probabilistic estimation model 328A may vary in time, as the satellites turn from a healthy status to unhealthy and vice versa. In such a case, the probabilistic estimation model 328A may adapt the process noise on the states that may not be observable in the local information and adjust the probabilistic estimation model 328A accordingly.

At step 350, the probabilistic estimation model 328A may be parametrized. In some embodiments, the processor 128 may be configured to parametrize the probabilistic estimation model 328A. Once the functional relationships in the probabilistic estimation model 328A have been determined in step 348, the probabilistic estimation model 328A may be parametrized based on a set of model parameters 350A that may be free to vary.

At step 352, variable basis probabilistic estimation model 328A may be determined. In some embodiments, the processor 128 may be configured to determine the variable basis probabilistic estimation model 328A. The probabilistic estimation model 328A may have a fixed parameter dependence but may also be defined in a variable basis form. For instance, the variance in the process noise associated with the integer ambiguity biases may not be known, but it may take one of two values as defined by the set of model parameters 350A. The probabilistic estimation model 328A, before the cycle slip detection, is called a variable basis model. It is the object of the adaptive post processing algorithm to determine the best parameters, and further fix the basis and the parameter dependence in the probabilistic estimation model 328A.

Figure 3D:
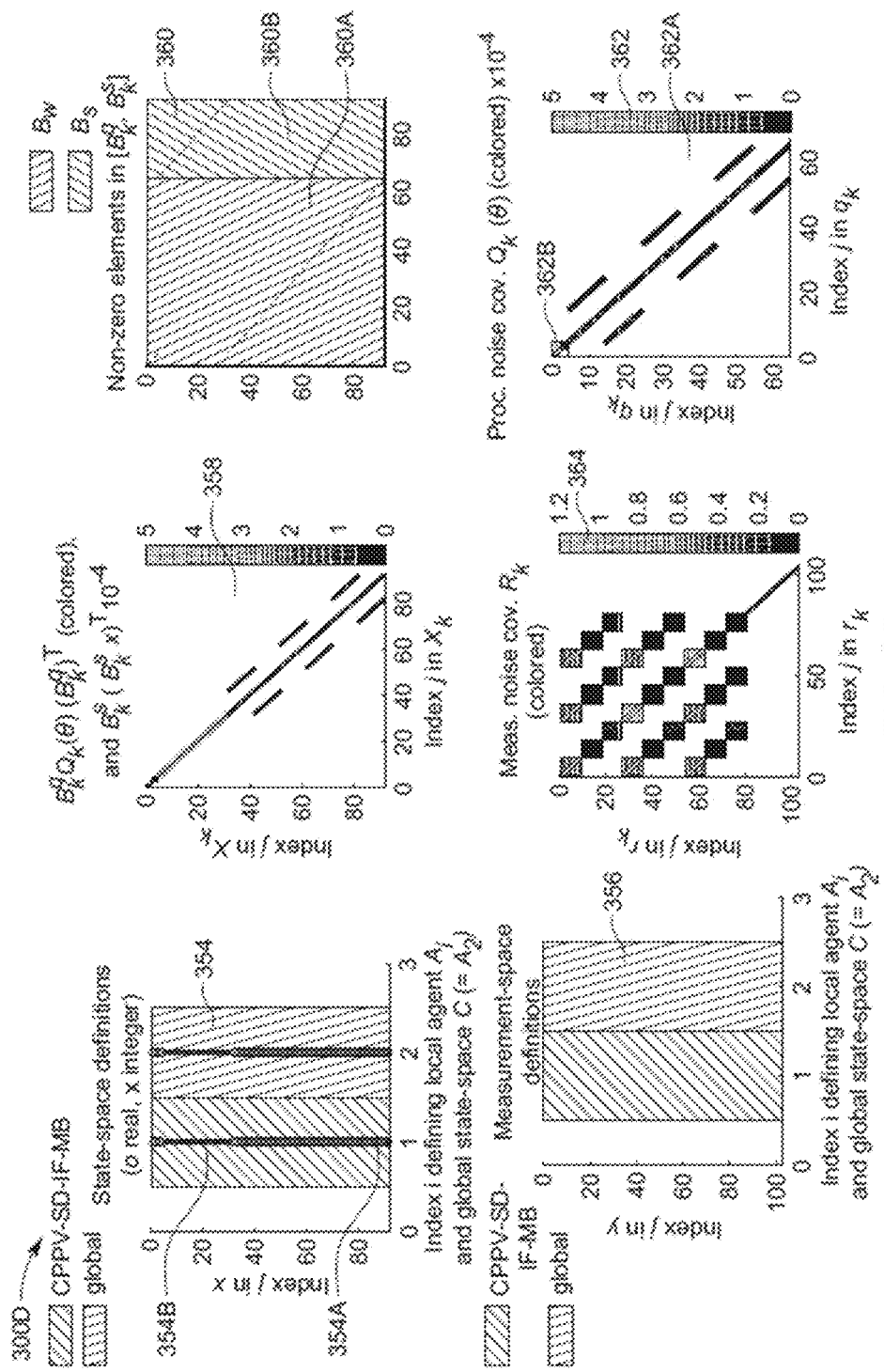
FIG. 3D shows a graphical illustration of key components of a mixed-integer probabilistic estimation model, according to an embodiment of the present disclosure.

FIG. 3D shows a graphical illustration 300D of key components of a mixed-integer probabilistic estimation model, according to an embodiment of the present disclosure. FIG. 3D is explained in conjunction with elements of FIG. 1A, FIG. 1B, FIG. 1C, FIG. 1D, FIG. 1E, FIG. 1F, FIG. 1G, FIG. 2A, FIG. 2B, FIG. 3A FIG. 3B and FIG. 3C. The graphical illustration 300D depicts the variable basis, mixed-integer estimation model in the context of double differenced (DD) measurements subject to ionosphere-free (IF) combinations on multiple frequency bands using only the GPS constellation of the GNSS system. The graphical illustration 300D may include multiple graphs for different states, measurement space, mean noise parameter, and the like.

A first graph 354 may depict multiple states. For example, the first graph 354 shows about 100 states. A set of real-valued state 354A may include the kinematic states of the receiver (for example position and velocity), as well as DD-IF biases relating to the ionospheric delays and tropospheric delays. A set of integer-valued states 354B may model the integer ambiguity biases.

A second graph 356 may depict the measurement space. In the measurement space, all measurements may be configured on the real numbers. For example, all of the states may be combined in "x" and all the measurements may be combined in "y", and both the states and the measurements may be governed by the dynamical system as described in equation 22 and equation 23.

Moreover, a third graph 358 may correspond to a full process noise covariance matrix. The full process noise covariance matrix may be the probabilistic estimation model 328A parameterized in the model parameters "θ". Further, the full process noise covariance matrix may have a particular structure arising from the differential relationships assumed between the states in the probabilistic estimation model 328A. For instance, the velocities may be time derivatives of positions, and that a change in position has no bearing on time delays experienced when a signal passes though the troposphere. In the third graph 358, crosses correspond to the integer random walks associated with the integer ambiguities. For such states to evolve on the integers, conventional process noise may be unable to drive their behavior, rather, such an example embodiment assumes a discrete random walk as described in equation 24. The last component of equation 24 may drive the integer random walk.

A fourth graph 360 depicts the map $B^R$ relating the process noise q to real-valued states 360A, and the map $B^Z$ relating the integer jump noise s to integer states 360B and may similarly contain many zero elements. It is recognized that in this and many other examples like those depicted in FIG. 1B and FIG. 1C, it is important to the estimation performance to correctly find the process noise covariance over real-valued states 362A depicted in a fifth graph 362, and particularly the process noise related to a motion model 362B depicted in the fifth graph 362.

As such, one embodiment of the adaptive post processing algorithm may define the model parameters, θ, to identify the process noise levels associated with the motion model of the receiver 102A in relation to the other modeled noise levels. In such an example, the measurement noise covariance matrix depicted by a sixth graph 364 may have a specific structure that may vary depending on if the measurements are undifferenced, SD, DD and/or IF. It is understood that the noise covariance matrix and the model depicted in FIG. 3D is but one example among many different models that may be considered in the adaptive post processing.

Figure 3E:
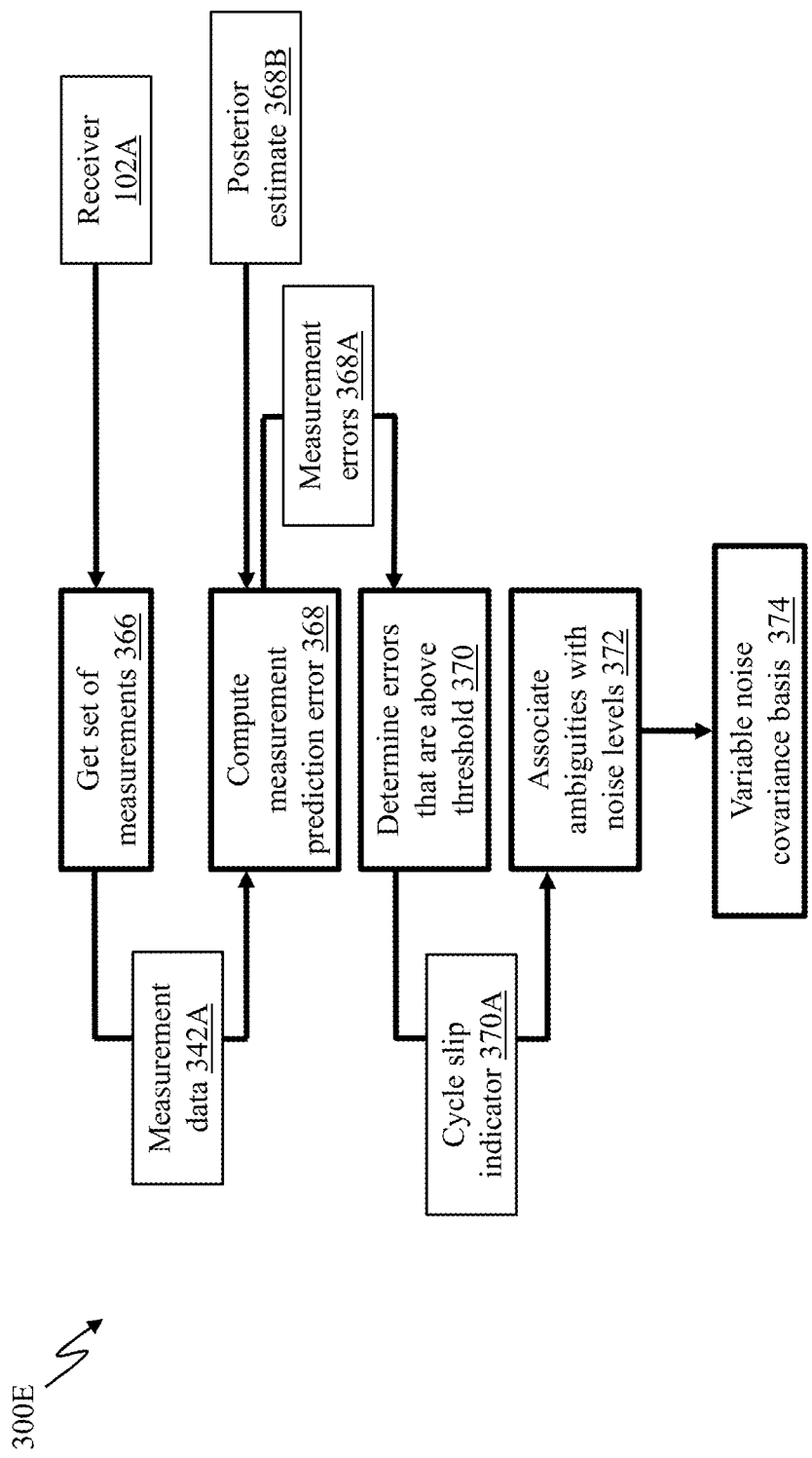
FIG. 3E shows a diagram depicting detection of cycle slips and adaptation of process noise of the probabilistic estimation model, according to an embodiment of the present disclosure.

FIG. 3E shows a diagram 300E depicting detection of cycle slips and adaptation of the process noise of the probabilistic estimation model 328A, according to an embodiment of the present disclosure. FIG. 3E is explained in conjunction with elements of FIG. 1A, FIG. 1B, FIG. 1C, FIG. 1D, FIG. 1E, FIG. 1F, FIG. 1G, FIG. 2A, FIG. 2B, FIG. 3A FIG. 3B, FIG. 3C and FIG. 3D. The diagram 300E depicts steps for the detection of cycle slips and adaptation of the process noise of the probabilistic estimation model 328A. The cycle slip detection algorithm may be utilized to determine the parameter dependence in the probabilistic estimation model 328A.

At step 366, the cycle slip detection algorithm may receive the set of measurements. In some embodiments, the processor 128 may be configured to receive the set of measurements from the receiver 102A of the plurality of receivers 102. In addition to the GNSS measurement signals, the set of measurements may further include the additional sensory information such as data from an inertial measurement unit (IMU).

At step 368, the measurement data 342A of the set of measurements may be used to compute a measurement prediction error 368A. In some embodiments, the processor 128 may be configured to utilize the measurement data 342A subsequently in combination with a posterior estimate 368B, such as the filtering or the smoothing posterior estimate. The measurement data 342A in combination with the posterior estimate 368B may be computed concurrently or prior to the cycle slip detection, to determine presence of the significant measurement prediction error 368A that may be attributed to any or many ambiguity dimensions. A set of such measurement prediction error 368A may be computed for each time step.

At step 370, measurement prediction errors 368A that may be above a pre-defined threshold may be determined. In some embodiments, the processor 128 may be configured to use a thresholding technique based on a pre-defined threshold. The pre-defined threshold may be used to determine if the cycle slip has occurred from one time step to the next time step. In case the cycle slip has occurred from one time step to the next time step, an indicator variable 370A for the given ambiguity at the given time may be set high.

At step 372, the ambiguities may be associated with the noise levels. In some embodiments, the processor 128 may be configured to associate the noise levels with the ambiguities. For example, the individual ambiguity dimensions with two different noise levels with exact magnitude are taken to be a part of the variable model parameters. As such, the indicator variable 370A may be used to fix the basis of the process noise of the probabilistic estimation model 328A. The indicator variable 370A may further be used to determine the parameter dependence without determining exactly what the parameters describing the high and the low noise levels may be. In other embodiments, the indicator variable 370A may include more than a binary state and may describe the probability that a cycle slip even has occurred.

At step 374, based on the association of the ambiguities with the noise levels, a variable noise covariance basis may be determined.

With respect to FIG. 3F, the indicator variable is further illustrated in relation to the time evolution of the integer biases.

FIG. 3F shows a diagram 300F illustrating probability density functions used to model the cycle slip events, and an integer random walk process used to model time evolution of integer ambiguity biases, according to an embodiment of the present disclosure. FIG. 3E is explained in conjunction with elements of FIG. 1A, FIG. 1B, FIG. 1C, FIG. 1D, FIG. 1E, FIG. 1F, FIG. 1G, FIG. 2A, FIG. 2B, FIG. 3A FIG. 3B, FIG. 3C and FIG. 3D.

The diagram 300F illustrates the probability density function of the integer jump noise "s" in a first graph 376, that may drive the integer random walk used to model the integer ambiguities' time evolution that is depicted in a second graph 378. As shown in the first graph 376, a probability density function 376B governing the integer noise process may be used to define a dynamical system, modeling a cycle slip behavior by which the integer biases sporadically jump to a different integer, before remaining at a constant integer for a long time. In relation to such an integer random walk process, it may be natural to approximate the discrete probability density function 376B with two continuous Gaussian distributions, such as a Gaussian distribution 376A and a Gaussian distribution 376C, when relaxing the probabilistic estimation model 328A and permitting the integer ambiguity estimates to reside on the real numbers. In one embodiment, the two distinct noise levels may be used to inflate or reduce the process noise of a given ambiguity dimension in the relaxed estimation when a cycle slip is likely to have occurred. The high or low state may be the parameter dependence that may be fixed by the cycle slip algorithm, however, the exact variance of the two depicted Gaussian probability density functions such as the Gaussian distribution 376A and the Gaussian distribution 376C may be taken as part of the model parameters that may be to be estimated and adapted by the adaptive post processing method.

As shown in the second graph 378, the time evolution of the integer ambiguities may be modeled as a stochastic process where the noise driving the integer ambiguity bias trajectory 378A is governed by a discrete jump noise process depicted in the first graph 376. In this example, there may be a number of, for example, 10 different ambiguities which sporadically exhibit cycle slip behavior in which individual biases jump from one integer to another integer. However, this number 10 is not construed to be a limitation of the scope of the present disclosure, and an equivalent number may be suitable used without deviating from the scope of the present disclosure.

Figure 3G:
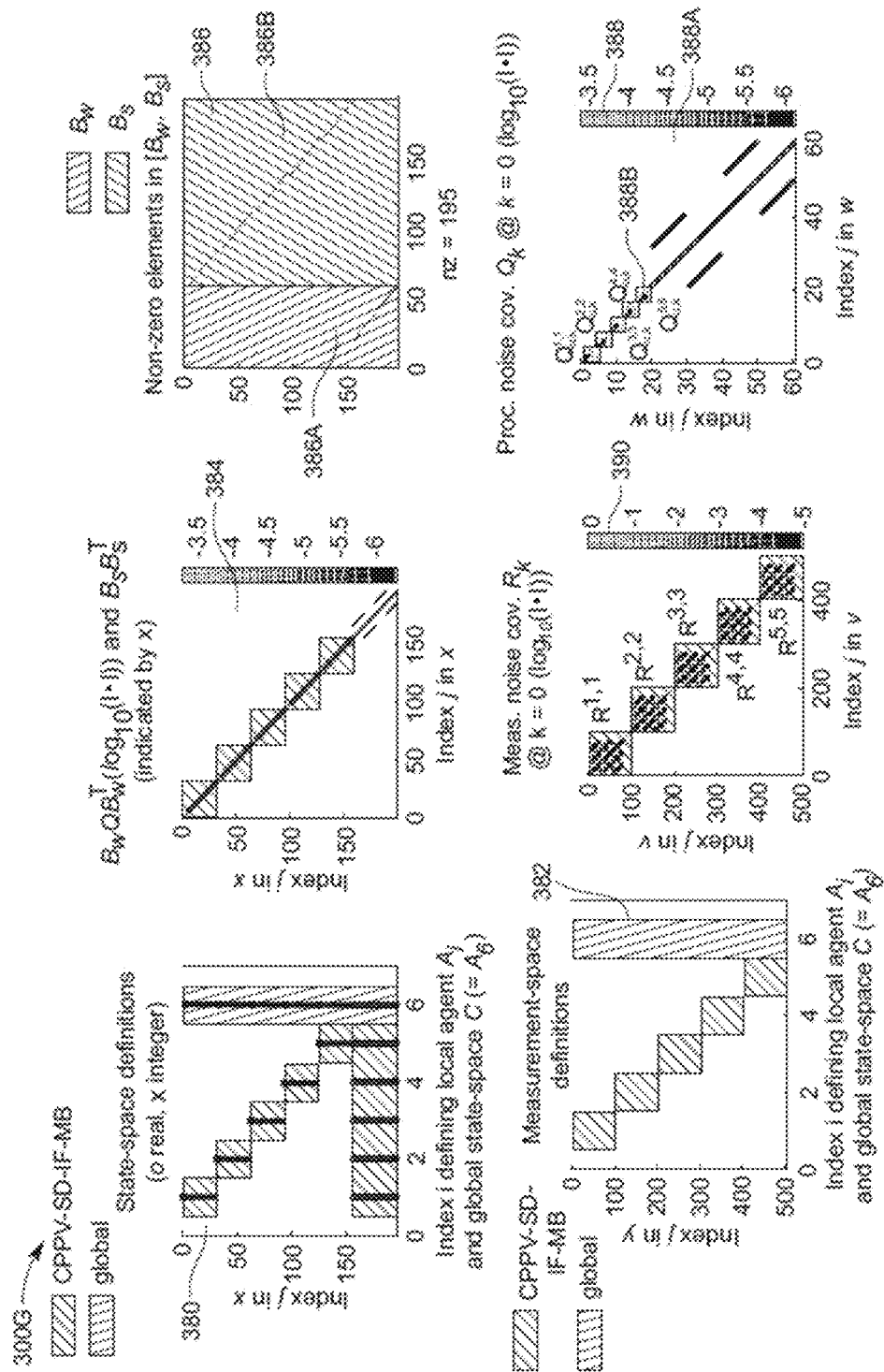
FIG. 3G shows a graphical illustration of key components of a mixed-integer estimation model for the plurality of receivers, according to an embodiment of the present disclosure.

FIG. 3G shows a graphical illustration 300G of key components of a mixed-integer estimation model for the plurality of receivers 102, according to an embodiment of the present disclosure. FIG. 3G is explained in conjunction with elements of FIG. 1A, FIG. 1B, FIG. 1C, FIG. 1D, FIG. 1E, FIG. 1F, FIG. 1G, FIG. 2A, FIG. 2B, FIG. 3A FIG. 3B, FIG. 3C, FIG. 3D, FIG. 3E and FIG. 3F. The graphical illustration 300G depicts the multi-receiver mixed-integer estimation model in the context of double differenced (DD) measurements subject to ionosphere-free (IF) combinations on multiple frequency bands using only the GPS constellation of the GNSS system. The graphical illustration 300E may include multiple graphs for different states, measurement space, mean noise parameter, and the like.

A first graph 380 may depict multiple states. For example, the first graph 354 shows about 180 states.

Similar to FIG. 3D, A second graph 382 may depict the measurement space. In the measurement space, all measurements may be configured on the real numbers. For example, all of the states may be combined in "x" and all the measurements may be combined in "y", and both the states and the measurements may be governed by the dynamical system depicted in FIG. 3D.

Moreover, a third graph 384 may correspond to a full process noise covariance matrix. The full process noise covariance matrix may be the probabilistic estimation model 328A parameterized in the model parameters "θ". Further, the full process noise covariance matrix may have a particular structure arising from the differential relationships assumed between the states in the probabilistic estimation model 328A. For instance, the velocities may be time derivatives of positions, and that a change in position has no bearing on time delays experienced when a signal passes though the troposphere. In the third graph 384, crosses correspond to the integer random walks associated with the integer ambiguities.

A fourth graph 386 depicts the maps the map $B^R$ relating the process noise q to real-valued states 386A, and the map $B^Z$ relating the integer jump noise s to integer states 386B. In some embodiments, the map $B^R$ relates the process noise q to real-valued states 386A, and the map $B^Z$ relates the integer jump noise s to integer states 386B may be sparse. It is recognized that in this and many other examples as depicted in FIG. 1B and FIG. 1C, it is important to the estimation performance to correctly find the process noise covariance over real-valued states 388A depicted in a fifth graph 388, and particularly the process noise related to a motion model 388B depicted in the fifth graph 388.

As such, one embodiment of the adaptive post processing algorithm may define the model parameters, θ, to identify the process noise levels associated with the motion model of the receiver 102A in relation to the other modeled noise levels. In such an example, the measurement noise covariance matrix depicted by a sixth graph 390 may have a specific structure that may vary depending on if the measurements are undifferenced, SD, DD and/or IF. It is understood that the noise covariance matrix and the model depicted in FIG. 3D is but one example among many different models that may be considered in the adaptive post processing in the multi-receiver setting.

Figure 4A:
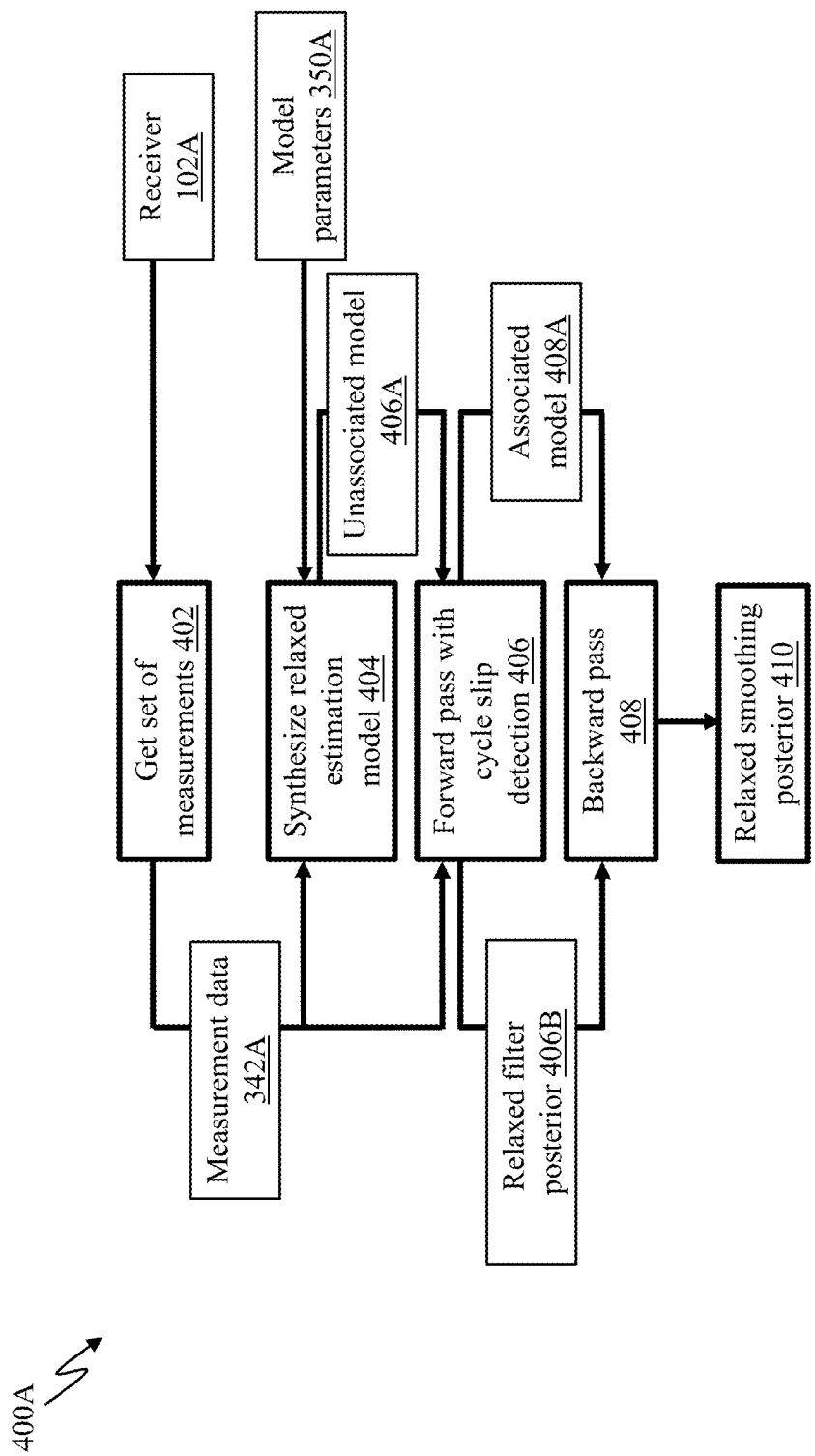
FIG. 4A shows a diagram depicting a smoothing process for the relaxed probabilistic estimation model based on configuration of integer biases on real numbers, according to an embodiment of the present disclosure.

Additional details on the smoothing algorithms and its implementation are further described in FIG. 4A.

FIG. 4A shows a diagram 400A depicting a smoothing process for the relaxed probabilistic estimation model based on configuration of integer biases on real numbers, according to an embodiment of the present disclosure. FIG. 4A is explained in conjunction with elements of FIG. 1A, FIG. 1B, FIG. 1C, FIG. 1D, FIG. 1E, FIG. 1F, FIG. 1G, FIG. 2A, FIG. 2B, FIG. 3A FIG. 3B, FIG. 3C, FIG. 3D, FIG. 3E, FIG. 3F and FIG. 3G. The diagram 400A depicts steps of the smoothing process for the relaxed probabilistic estimation model. The diagram 400A describes the relaxed smoothing problem with respect to the relaxed probabilistic estimation model 328A where the integer ambiguity biases may be permitted to reside on the real numbers.

At step 402, the set of measurements may be received. In some embodiments, the processor 128 may be configured to receive the set of measurements from the plurality of receivers 102.

At step 404, the measurement data 342A or the set of measurements may be utilized to synthesize the relaxed probabilistic estimation model 328A. In some embodiments, the processor 128 may be configured to utilize the measurement data 342A to synthesize the relaxed probabilistic estimation model 328A, as outlined in FIG. 3C. The relaxed probabilistic estimation model 328A may be parameterized by the model parameters 350A, as described in FIG. 3A. The model parameters 350A may be either received from the user on the first iteration, or computed by means of a parameter update on the second and the subsequent iterations.

At step 406, the forward pass algorithm may be utilized with the cycle slip detection. In some embodiments, on the first iteration of the method, the cycle slip detection may be used to associate the model parameters 350A with the probabilistic estimation model 328A. For example, unassociated models 406A that may not have all the parameters associated with the maps may be utilized for the forward pass algorithm. The forward pass algorithm may be executed given the probabilistic estimation model 328A, where the integer random walk may be taken to be gaussian noise that may be variably scaled based on the model parameters 350A and the indicator variable 370A computed in the cycle slip algorithm. Based on the forward pass algorithm, a relaxed filter posterior 406B may be determined.

At step 408, the backward pass algorithm may be utilized. In some embodiments, the processor 128 may be configured to utilize the backward pass algorithm. For example, associated models 408A that may have all the parameters associated with the maps may be utilized for the backward pass algorithm. The processor 128 may utilize the relaxed filter posterior 406B as the starting point for the backward pass algorithm as described in relation to FIG. 1F. At step 410, based on the backward pass algorithm, a relaxed smoothing posterior may be computed. In some embodiments, the processor 128 may be configured to compute the relaxed smoothing posterior based on the backward pass algorithm.

It is understood that it may be infeasible to execute conventional moment matching filters in such a setting, as the probabilistic estimation model 328A may be large. Therefore, in an embodiment, the system 126 may rely on partially linear moment approximations and explicit linearization of the nonlinearities to implement the RTS or FP smoothers for generating the smoothing posterior.

Such a method may enable the Q-function to be computed based on the smoothing posterior. It may be acknowledged that for linear time-varying Gaussian systems, such as those previously described, it may be possible to compute the majorizing Q-function of the negative measurement log-likelihood given the model parameters as follows:

$$Q(\theta, \theta^{(i)}) \simeq \sum_{k=0}^{K-1} \log \det(Q_k(\theta)) + \sum_{k=0}^{K} \log \det(R_k(\theta)) + \\ \sum_{k=0}^{K} \text{Trace}\{(R_k(\theta)^{-1} E[(y_k - C_k(\theta)x_k)(*)^T \mid y_{0:K}] + \\ \sum_{k=0}^{K-1} \text{Trace}\{(Q_k(\theta)^{-1} E[(x_{k+1} - A_k(\theta)x_k)(*)^T \mid y_{0:K}]\} \qquad \text{Eq. 25}$$

In an example, the probabilistic estimation model 328A model may be linear in the states and the elements of the maps A and Q may be related to a parameter vector as $\theta = (\theta_A, \theta_Q) = (\text{vec}(A), \text{vec}(Q))$. In such an example, it may be possible to perform one final pass over the smoothing posterior and compute the following quantities:

$$\Psi = \frac{1}{K} \sum_{k=0}^{K-1} P_{k+1}^s + m_{k+1}^s (m_{k+1}^s)^T \quad \text{Eq. 26}$$

$$\Gamma = \frac{1}{K} \sum_{k=0}^{K-1} P_{k+1}^s (G_k^s)^T + m_{k+1}^s (m_k^s)^T \quad \text{Eq. 27}$$

$$\Phi = \frac{1}{K} \sum_{k=0}^{K-1} P_k^s + m_k^s (m_k^s)^T \quad \text{Eq. 28}$$

In such a case, the minimizer of the Q-function with respect to θ may then be determined analytically as:

$$\theta_A^* = vec \, (\Gamma \Phi)^{-1} \quad \text{Eq. 29}$$

$$\theta_Q^* = vec \, (\Psi - \Gamma A^{-1} - \Gamma A + A \Phi A^T) \quad \text{Eq. 29}$$

However, it is also recognized that the probabilistic estimation model 328A used on the adaptive post processing has structure, and that many elements of the maps in the probabilistic estimation model 328A will be zeros by necessity. As such, it is imperative to only update the model parameters 350A of the probabilistic estimation model 328A that are known a priori to be non-zero. Furthermore, it is realized that the conventional EM method works in a time-invariant setting, but the problem may become complicated and difficult to solve under variable sample rates.

As such, one embodiment of the method described parametrizes the maps A and Q of the probabilistic estimation model 328A in a sequence of time-varying matrix bases, that may be defined in the model synthesis step (such as the step 404). Based on the selection of the desired basis, it is recognized that the Q-function may be expressed as:

$$Q(\theta; \theta^{(i)}) \triangleq \quad \text{Eq. 30}$$

$$\sum_{i=1}^{D(\theta_Q)} \{-M^{(i)} \log([\theta_Q]_i) [\theta_Q]_i ((\theta_Q)^T H^{(i)} \theta_A + (f^{(i)})^T \theta_A + c^{(i)})\}$$

Moreover, under mild assumptions that may be met by the considered probabilistic GNSS estimation model 328A, the optimization problem is depicted as:

$$\theta_A^* = \text{argmin}_{\theta_A} Q(\theta; \theta^{(i)}) \, | \, \theta_Q = \theta_Q^0 \quad \text{Eq. 31}$$

$$\theta_Q^* = \text{argmin}_{\theta_Q} Q(\theta; \theta^{(i)}) \, | \, \theta_A = \theta_A^0 \quad \text{Eq. 32}$$

The solution to the abovementioned problem is given by the following equations:

$$\theta_A^* = -(2H)^{-1} f \quad \text{Eq. 32}$$

$$[\theta_Q^*]_i = \frac{M^{(i)}}{(\theta_A^0)^T H^{(i)} \theta_A^0 + (f^{(i)})^T \theta_A^0 + c^{(i)}} \quad \text{Eq. 33}$$

$$H = H^{(0)} + \sum_{i=1}^{D(\theta_Q)} [\theta_Q^0]_i H^{(i)} \quad \text{Eq. 34}$$

$$f = f^{(0)} + \sum_{i=1}^{D(\theta_Q)} [\theta_Q^0]_i f^{(i)} \quad \text{Eq. 35}$$

It is also recognized that such a method of updating the model parameters 350A may be implemented to only target specific parts of the probabilistic estimation model 328A. This includes, but is not limited to, the inverse variance of the random walks driving the kinematic states of the receiver, the inverse variance of the high and low relaxed process noise PDFs used to drive the real-valued ambiguity biases in the relaxed estimation model, the inverse variance of the remaining real-valued biases and their velocities, the time constants in singer motion models, and other parameters in the motion models governing the movement of the receiver 102A. In some embodiments, a similar update may be utilized to update the model parameters 350A of the probabilistic estimation model 328A as well, most notably the inverse variance of the measurement noises.

It is recognized that updating the parameters in such a manner may reduce the number of parameters that may have to be modeled, from in the order of 10000 parameters in the case of the probabilistic estimation model 328A outlined in FIG. 3C to as few as 10 parameters, thus speeding up computation times. It is further recognized that implementing an update in this manner also, empirically, drastically improves the convergence rates of the EM and significantly reduces the total amount of EM iteration required to converge to a suitable set of the model parameters 350A.

Furthermore, in some embodiments, the Q-function may be such that the Q-function complements with a regularizing term to cause assumed sparsity patterns in the resulting probabilistic estimation model. The regularizing term or the regularizer may be added to the probabilistic estimation model 328A to prune parameters from the probabilistic estimation model 328A. In one example, this may be done by using a form of lasso regression on the above Q-function, using an l1 or weighted l1-regularizer to promote hypothesized sparsity patterns in the probabilistic estimation model 328A. It is acknowledged that within the scope of the disclosure, other regularizer may also be used, such as Huber-type regularizers.

Figure 4B:
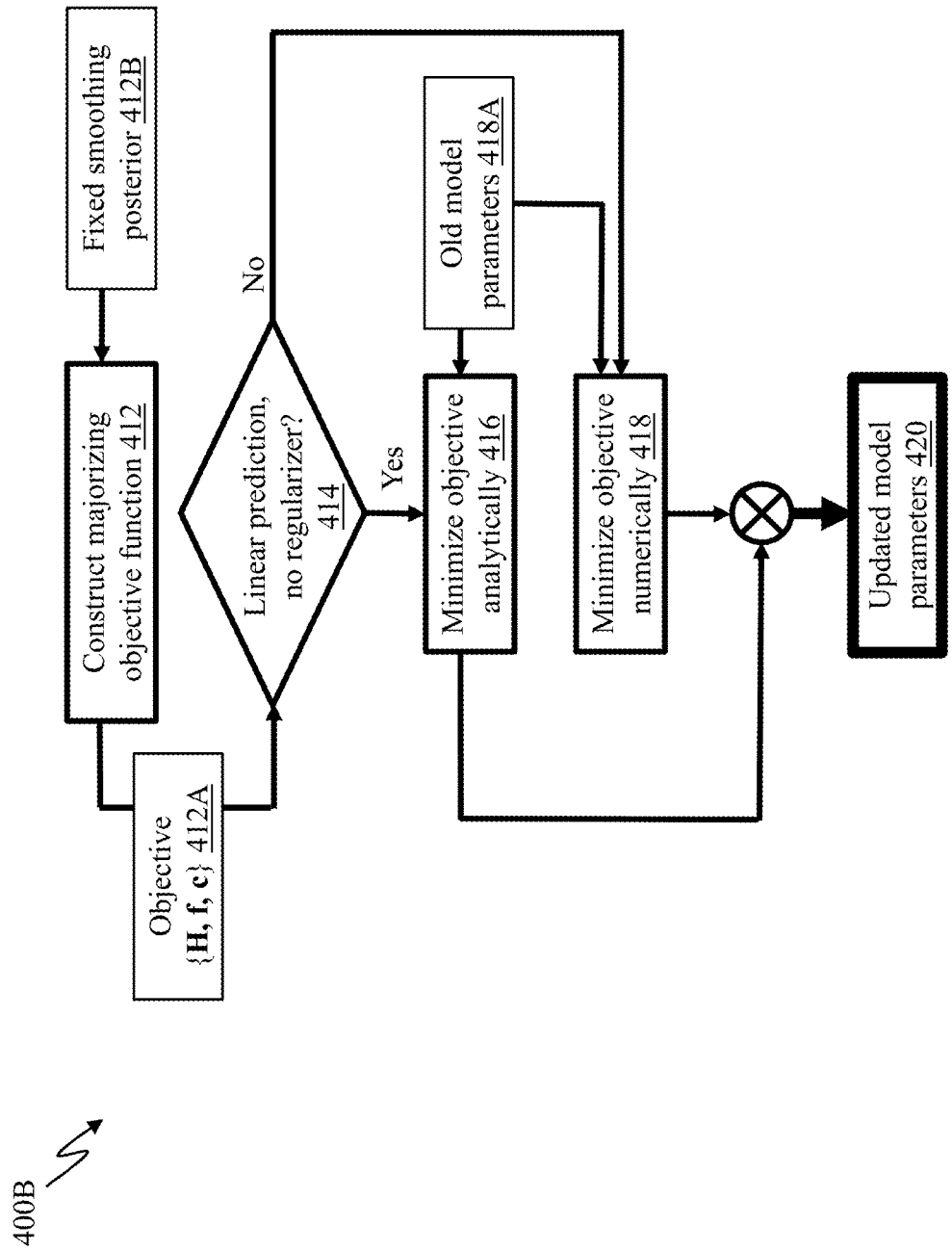
FIG. 4B shows a diagram depicting computation and minimization of a majorizing Q-function, according to an embodiment of the present disclosure.

FIG. 4B shows a diagram 400B depicting computation and minimization of a majorizing Q-function, according to an embodiment of the present disclosure. FIG. 4B is explained in conjunction with elements of FIG. 1A, FIG. 1B, FIG. 1C, FIG. 1D, FIG. 1E, FIG. 1F, FIG. 1G, FIG. 2A, FIG. 2B, FIG. 3A FIG. 3B, FIG. 3C, FIG. 3D, FIG. 3E, FIG. 3F, FIG. 3G and FIG. 4A. The diagram 400B depicts steps for the computation and minimization of a majorizing Q-function.

At step 412, a majorizing objective function is constructed by defining a set of maps $\{H_i, f_i, c_i\}_i$ 412A given a smoothing posterior 412B. At step 414, the processor 128 may be configured to check if the prediction model or the probabilistic estimation model 328A is linear or there is no regularizer specified. In case the probabilistic estimation model 328A is linear or there is no regularizer specified, at step 416, the solution to the optimization problem may be computed analytically. In case the regularizer is specified or the dependence of the parameters is nonlinear in the prediction model, at step 418, an optimizer may be used to numerically optimize the Q-function using old model parameters 418A. The old model parameters 416A may be for example, the model parameters 350A. At step 420, once the Q-function has been optimized to yield the updated model parameters, the updated model parameters may be reported as output.

It may be understood that other majorizing functions other than the two above forms may be used in the minimization procedure. The exact form of the Q-function may depend on the modeling assumptions, that in turn may change based on the model of the receiver 102A and the noise modeling.

Figure 4C:
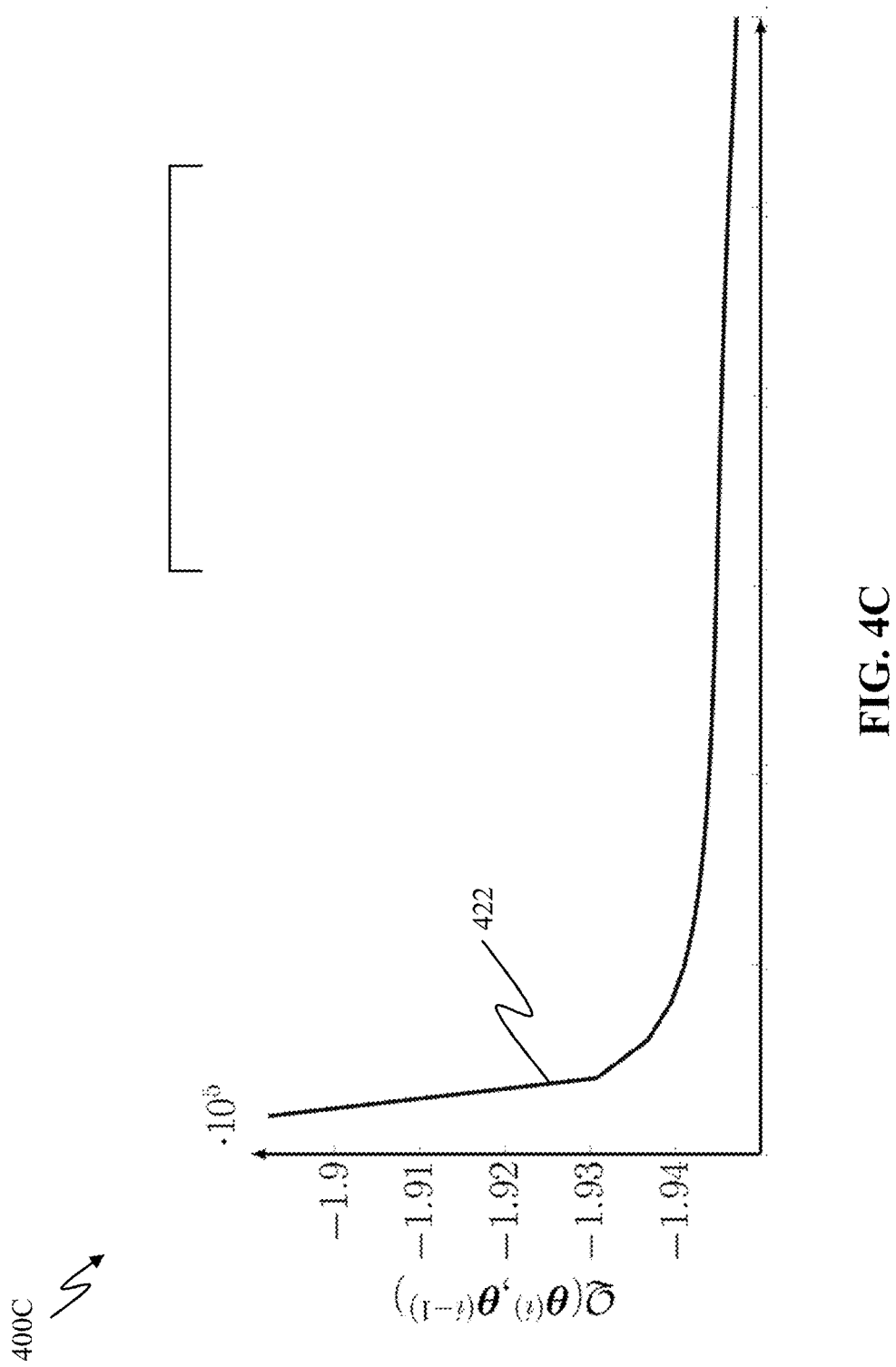
FIG. 4C shows a graphical illustration depicting decaying of the Q-function as a function of expectation maximization (EM) iterations, according to an embodiment of the present disclosure.

FIG. 4C shows a graphical illustration 400C depicting decaying of the Q-function as a function of expectation maximization (EM) iterations, according to an embodiment of the present disclosure. FIG. 4C is explained in conjunction with elements of FIG. 1A, FIG. 1B, FIG. 1C, FIG. 1D, FIG. 1E, FIG. 1F, FIG. 1G, FIG. 2A, FIG. 2B, FIG. 3A FIG. 3B, FIG. 3C, FIG. 3D, FIG. 3E, FIG. 3F, FIG. 3G, FIG. 4A and FIG. 4B. The graphical illustration 400C shows a Q-function 422.

The graphical illustration 400C depicts decrease of the sequences of Q-function minima as a function of the EM iterations when evaluated using one of the Q-functions 422 described with respect to the previous FIGS. The probabilistic estimation model 328A may continuously improve the model parameters 350A over the EM executions, reducing the negative log likelihood, thus increasing the likelihood of the model parameters 350A being correct. Moreover, once a sufficiently correct model has been found, that may be determined by a threshold applied to the relative change of the Q-function 422 over the consecutive EM iterations or by the number of iterations reaching a specified maximum, the integer biases, that up until this point may have been configured on the real numbers, need to be fixed to the integers.

Figure 4D:
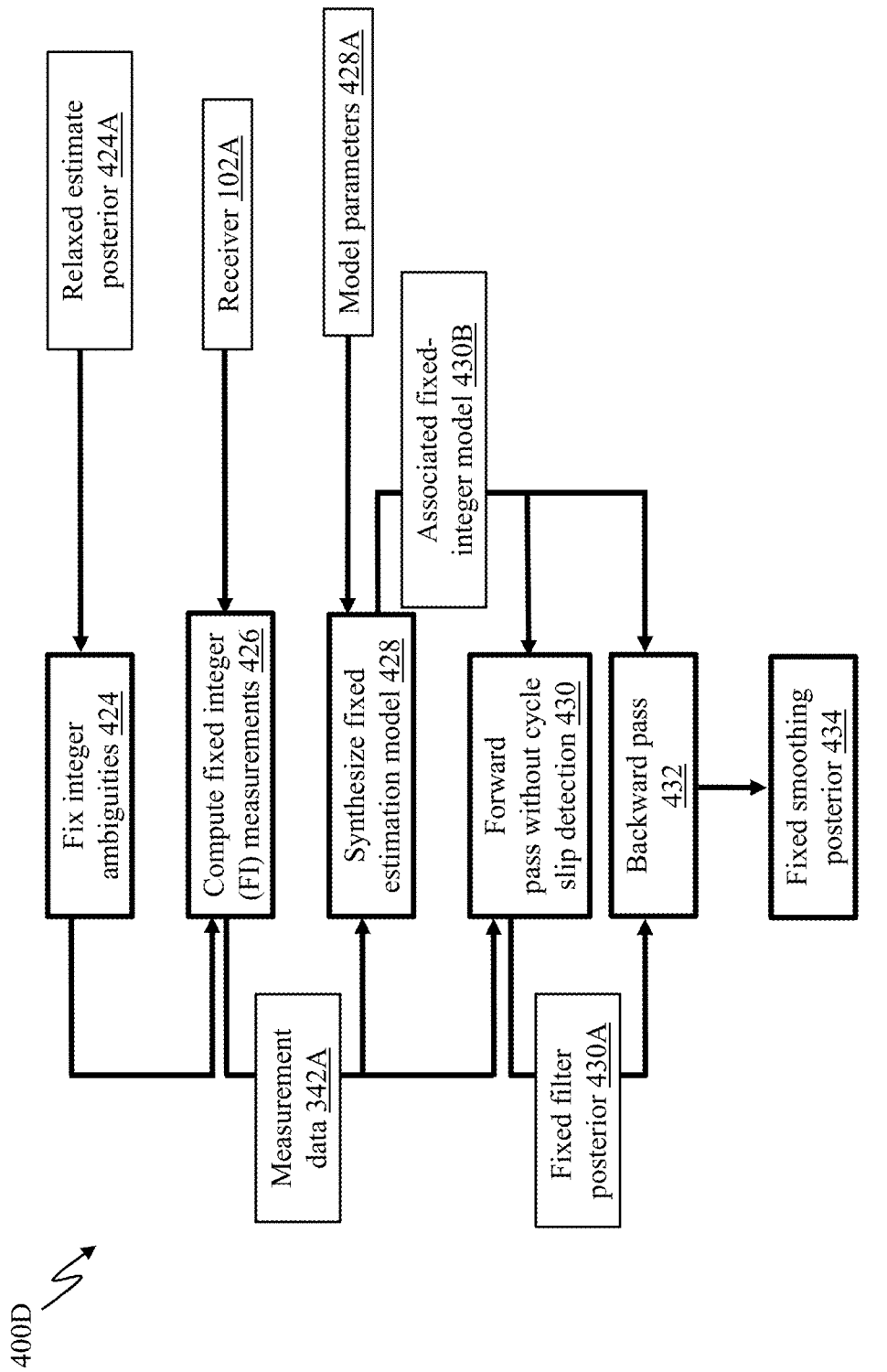
FIG. 4D shows a diagram depicting the smoothing process performed with respect to integer fixed probabilistic estimation model, where integer biases are configured on integers, according to an embodiment of the present disclosure.

The fixing of the integer biases to the integers is further explained in FIG. 4D.

FIG. 4D shows a diagram 400D depicting the smoothing process performed with respect to integer fixed probabilistic estimation model, where integer biases are configured on integers, according to an embodiment of the present disclosure. FIG. 4D is explained in conjunction with elements of FIG. 1A, FIG. 1B, FIG. 1C, FIG. 1D, FIG. 1E, FIG. 1F, FIG. 1G, FIG. 2A, FIG. 2B, FIG. 3A FIG. 3B, FIG. 3C, FIG. 3D, FIG. 3E, FIG. 3F, FIG. 3G, FIG. 4A, FIG. 4B and FIG. 4C.

The diagram 400D illustrates the steps of the method that are employed once sufficiently good model parameters have been determined by the system 126 or the user requests an output. At step 424, based on the relaxed smoothing posterior 424A computed for the most recent model parameters 350A, the integer ambiguities may be fixed. It is recognized that some embodiments fix on the filter posterior, while others fix the integer biases on the smoothing posterior. It is also recognized that the fixation may be performed in many ways, and that the exact method may be immaterial to the present disclosure. In an example, a decorrelating unimodular transform may be utilized to fix the integers in the decorrelated space before mapping the fixed integers back into the original ambiguity space. In such an example, the fixation may be done using a simple bootstrapping method. In other examples, the fixation may be done using branch and bound optimization methods. In yet other examples, the fixation may be done using simple rounding. In some example embodiments, the decorrelating transform may be computed using a variant of the LAMDA algorithm or using Psiaki's reduction algorithms.

At step 426, once the ambiguities have been fixed, the ambiguities may be removed from the measurement data 342A gathered from the receiver 102A yielding fixed integer measurements that may correspond to a fixed-integer measurement model in which the integer biases have been removed from the estimation problem. Based on the integer biases, at step 428, a new measurement model may be synthesized and model parameters 428A computed previously may be used to parametrize the fixed-integer measurement model. At step 430, the forward pass algorithm may be executed without the cycle slip detection, as the integer ambiguities are no longer a part of the estimation problem, resulting in a fixed integer filtering posterior 430A. The forward pass algorithm may be executed based on associated fixed-integer model 430B. At step 432, the fixed integer filtering posterior 430A may be followed by the backward pass algorithm that may correct the fixed integer filtering posterior 430A yielding a fixed integer smoothing posterior at step 434.

It is recognized that it would be possible to condition the original relaxed smoothing posterior on the integer biases, but this may lead to jitter in the estimation errors of the fixed integer smoothing posterior at times when the integers may not be fixed correctly. As such, in some embodiments, a smaller fixed-integer model may be synthesized, and the measurements may be converted to fixed-integer measurements before running the final smoothing pass.

Figure 5:
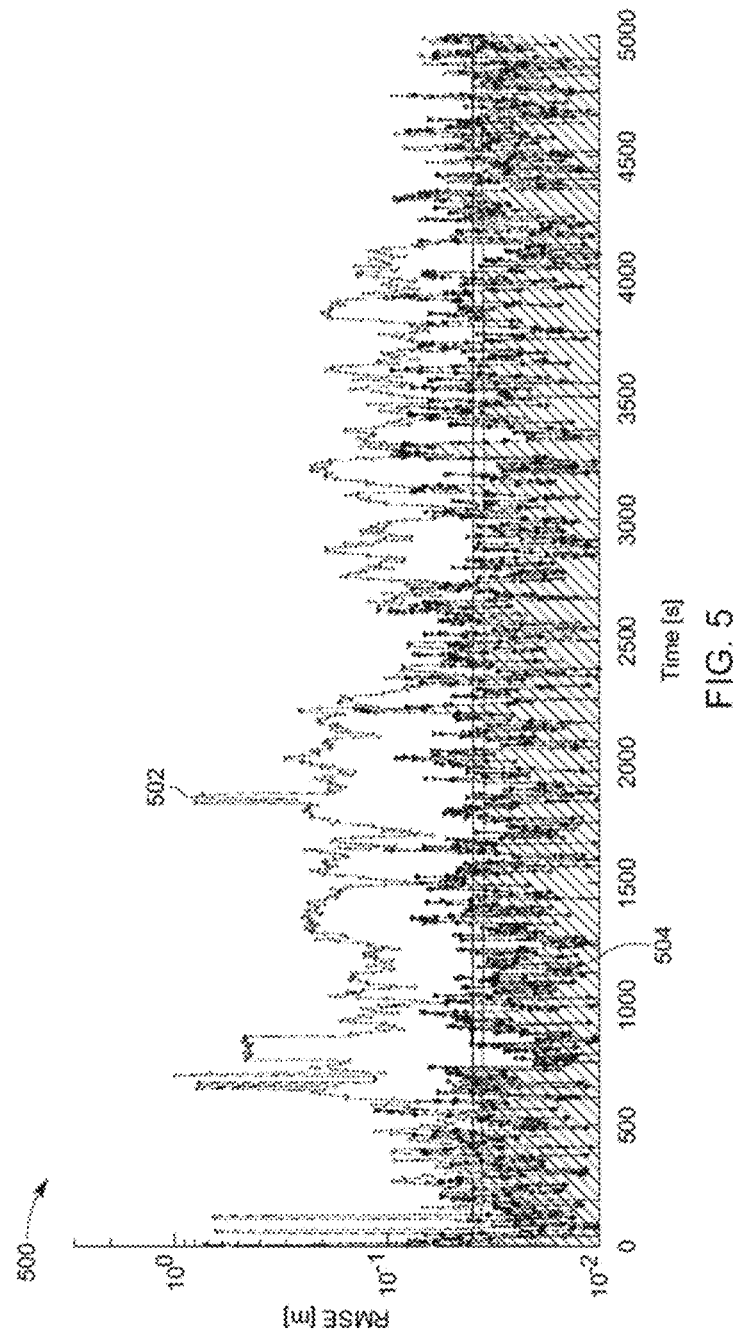
FIG. 5 shows a graphical illustration depicting an impact of optimizing model parameters in an adaptive GNSS post processing method with reference to positional estimation errors, according to an embodiment of the present disclosure.

FIG. 5 shows a graphical illustration 500 depicting an impact of optimizing model parameters in an adaptive GNSS post processing method with reference to positional estimation errors, according to an embodiment of the present disclosure. FIG. 5 is explained in conjunction with elements of FIG. 1A, FIG. 1B, FIG. 1C, FIG. 1D, FIG. 1E, FIG. 1F, FIG. 1G, FIG. 2A, FIG. 2B, FIG. 3A FIG. 3B, FIG. 3C, FIG. 3D, FIG. 3E, FIG. 3F, FIG. 3G, FIG. 4A, FIG. 4B, FIG. 4C and FIG. 4D.

The graphical illustration 500 illustrates the effect of using the adaptive post processing described in the disclosure when the model parameters may not be defined appropriately. In an embodiment, the estimation errors, specifically sum root-mean-square error, relating to the positional states of the receiver 102A may be noticeably higher when only the adaptive RTS smoother is used together with integer fixation depicted by a peak 502. However, when permitting the estimation algorithm to simultaneously update the model parameters using the EM iterations and the method outlined in FIG. 3A, a set of model parameters may be determined for which the resulting position root-mean-square error is significantly lower as depicted in a region 504 of the graphical illustration 500.

Figure 6:
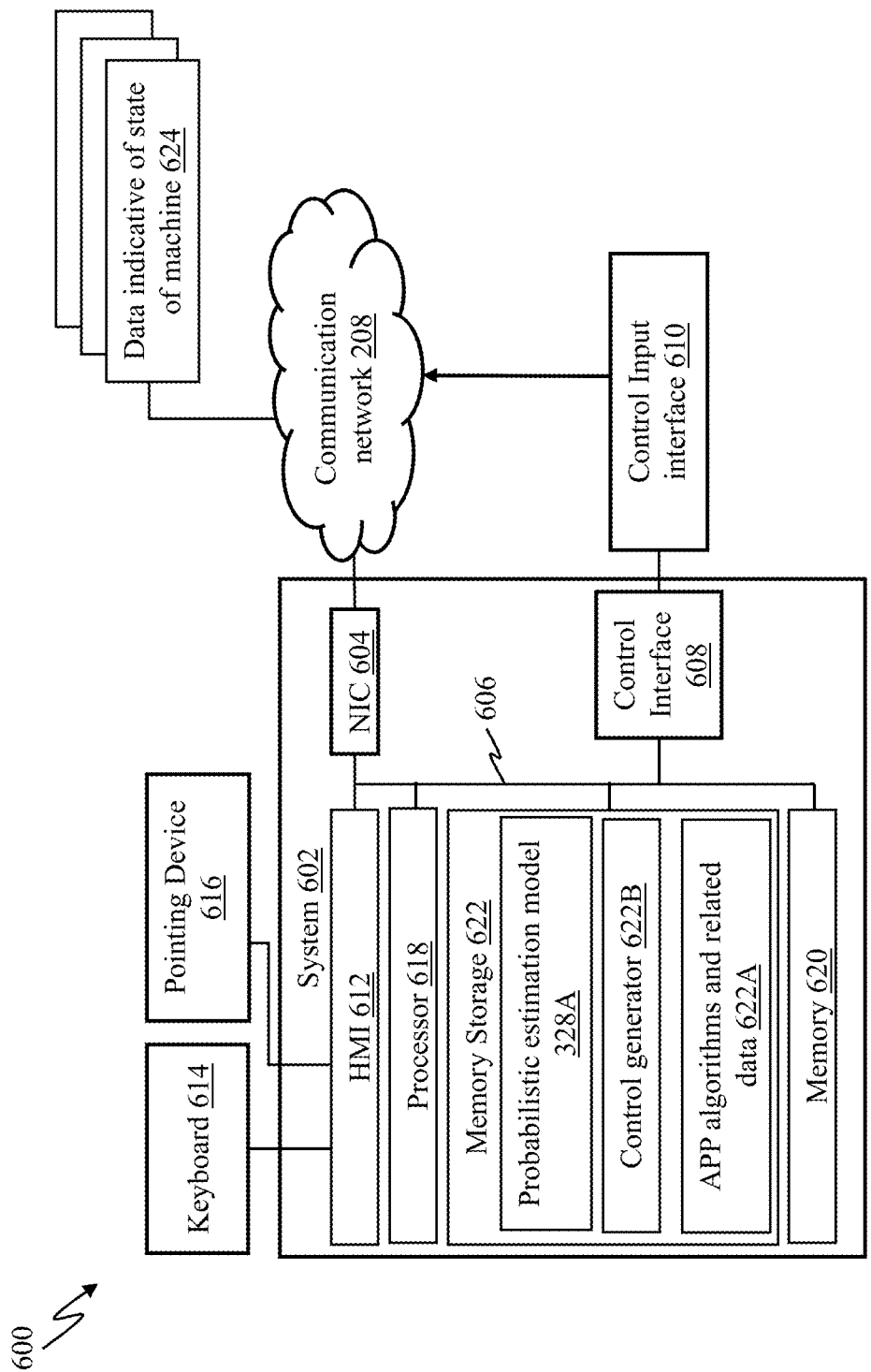
FIG. 6 shows a block diagram of a system to implement a post-processing solution used to aid tracking of mixed-autonomy vehicles, according to an embodiment of the present disclosure.

FIG. 6 shows a block diagram 600 of a system 602 to implement post-processing solution used to aid tracking of mixed-autonomy vehicles, according to an embodiment of the present disclosure. FIG. 6 is explained in conjunction with elements of FIG. 1A, FIG. 1B, FIG. 1C, FIG. 1D, FIG. 1E, FIG. 1F, FIG. 1G, FIG. 2A, FIG. 2B, FIG. 3A FIG. 3B, FIG. 3C, FIG. 3D, FIG. 3E, FIG. 3F, FIG. 3G, FIG. 4A, FIG. 4B, FIG. 4C, FIG. 4D and FIG. 5. The system 602 may include a network interface controller (NIC) 604, a bus 606, a control interface 608 coupled to a control input interface 610, and a human-machine interface (HMI) 612. The HMI 612 may communicate with a keyboard 614 and a pointing device 616. The system 602 may further include a processor 618, a memory 620 and a memory storage 622. The memory storage 622 may include the probabilistic estimation model 328A, an adaptive post-processing (APP) algorithms and related data 622A, and a control generator 622B. The block diagram 600 may further include the communication network 208. In some embodiments, the system 602 may be same as the system 126 as described in FIG. 1D and FIG. 2A.

The block diagram 600 of the system 602 may be utilized for joint tracking and/or control of the plurality of receivers 102 integrated with the plurality of vehicles or the aquatic buoys. The system 602 may have a number of different interfaces connecting the system 602 with other machines and devices used for the joint tracking and/or control of the plurality of receivers 102. The NIC 604 may include a receiver adapted to connect the system 602 through the bus 606 to the communication network 208 connecting the system 602 to receive the GNSS signals and other sensory data from the plurality of receivers 102.

In some embodiments, the APP system, such as the system 602 may be configured only to track the state of the one or more receivers of the plurality of receivers 102. In one or more embodiments where the one or more receivers may be attached to mobile vehicles, the system 602 may be configured to further control the motion of the vehicle either individually or as a platoon. To that end, in some embodiments, the system 602 may be configured to receive the traffic state of a group of mixed-autonomy vehicles traveling in the same direction, such that the group of mixed-autonomy vehicles may include controlled vehicles willing to participate in a platoon formation and at least one uncontrolled vehicle. The traffic state may be indicative of a state of each vehicle in the group and the controlled vehicle. For example, in one embodiment, the traffic state may include current headways, current speeds, and current acceleration of the mixed-automata vehicles. In some embodiments, the mixed-automata vehicles include all uncontrolled vehicles within a predetermined range from flanking controlled vehicles in the platoon.

The NIC 604 may also include a transmitter adapted to transmit the control commands to the controlled vehicles via the communication network 208. To that end, the system 602 may include an output interface, e.g., the control interface 608, configured to submit the control commands via a control input interface 610 to the controlled vehicles in the group of mixed-autonomy vehicles through the communication network 208. In such a manner, the system 602 may be arranged on a remote server in direct or indirect wireless communication with the mixed-automata vehicles.

The system 602 may further include other types of input and output interfaces. For example, the system 602 may include the HMI 612. The HMI 612 may connect the NIC 604 to the keyboard 614 and the pointing device 616. For example, the pointing device 616 may include a mouse, trackball, touchpad, joystick, pointing stick, stylus, touchscreen, and the like.

The system 602 may further include the processor 618 configured to execute stored instructions, as well as the memory 620 that stores instructions that are executable by the processor 618. The processor 618 may be a single-core processor, a multi-core processor, a computing cluster, or any number of other configurations. The memory 620 may include random access memory (RAM), read-only memory (ROM), flash memory, or any other suitable memory machines. The processor 618 may be connected through the bus 606 to one or more input and output devices.

The processor 618 may be operatively connected to a memory storage 622 storing the instructions as well as processing data used by the instructions. The memory storage 622 may form a part of or be operatively connected to the memory 620. For example, the memory storage 622 may be configured to store the probabilistic estimation model 328A, the APP algorithms and related data 622A, and optionally, the control generator 622B.

The processor 618 may be further configured to determine control commands for the controlled vehicles that indirectly control the uncontrolled vehicles as well. To that end, the processor 618 may be configured to execute the control generator 622B to determine control commands based on the state of the vehicles. In some embodiments, the control generator 622B uses a deep reinforcement learning (DRL) controller trained to generate control commands from the augmented state for an individual and/or a platoon of vehicles. The system 602 may output data indicative of the state of machine 624, such as the vehicles.

Figure 7A:
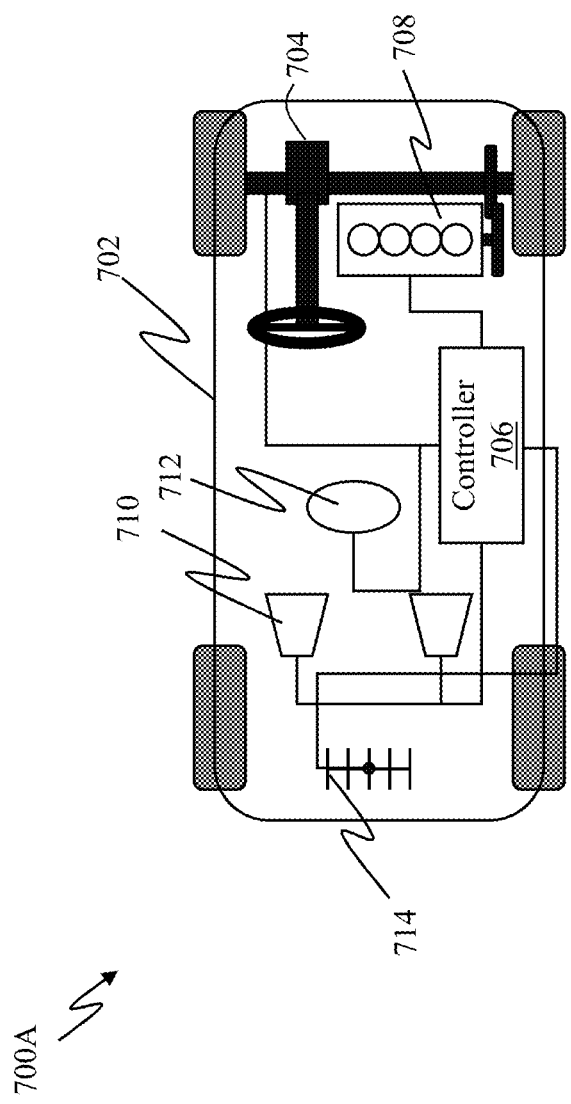
FIG. 7A shows a schematic diagram of a vehicle controlled directly or indirectly, according to an embodiment of the present disclosure.

FIG. 7A shows a schematic diagram 700A of a vehicle controlled directly or indirectly, according to an embodiment of the present disclosure. FIG. 7A is explained in conjunction with elements of FIG. 1A, FIG. 1B, FIG. 1C, FIG. 1D, FIG. 1E, FIG. 1F, FIG. 1G, FIG. 2A, FIG. 2B, FIG. 3A FIG. 3B, FIG. 3C, FIG. 3D, FIG. 3E, FIG. 3F, FIG. 3G, FIG. 4A, FIG. 4B, FIG. 4C, FIG. 4D, FIG. 5 and FIG. 6.

The schematic diagram 700A includes a vehicle 702 controlled directly or indirectly according to some embodiments. As used herein, the vehicle 702 may be any type of wheeled vehicle, such as a passenger car, bus, or rover. In some embodiments, the vehicle 702 may be an autonomous or semi-autonomous vehicle. For example, some embodiments control the motion of vehicle 702. Examples of the motion may include lateral motion of the vehicle 702 controlled by a steering system 704 of the vehicle 702. In one embodiment, the steering system 704 may be controlled by a controller 706 in communication with the system 602. Additionally, or alternatively, the steering system 704 may be controlled by a driver of vehicle 702.

The vehicle 702 may further include an engine 708, that may be controlled by the controller 706 or by other components of the vehicle 702. The vehicle 702 may also include one or more sensors 710 to sense the surrounding environment. Examples of the one or more sensors 710 may include distance range finders, radars, lidars, and cameras. The vehicle 702 may also include one or more sensors 712 to sense its current motion quantities and internal status. Examples of the sensors 712 include GNSS signals, accelerometers, inertial measurement units, gyroscopes, shaft rotational sensors, torque sensors, deflection sensors, pressure sensor, and flow sensors. The one or more sensors 710 and the one or more sensors 712 may provide information to the controller 706. The vehicle 702 may be equipped with a transceiver 714 enabling communication capabilities of the controller 706 through wired or wireless communication channels.

Figure 7B:
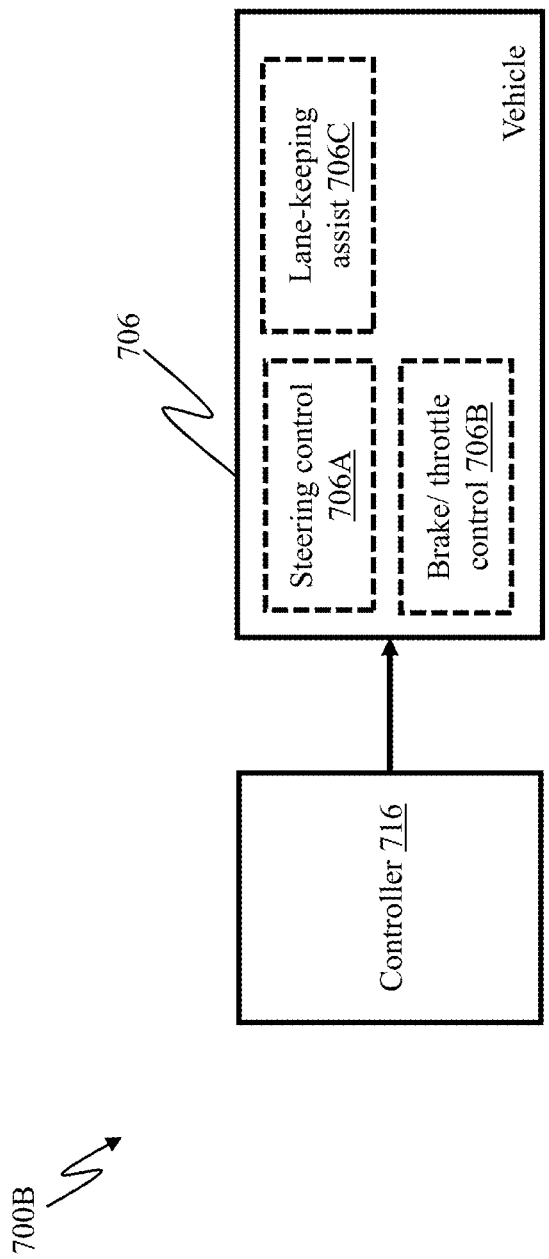
FIG. 7B shows a schematic diagram of interaction between a controller of the system receiving controlled commands and controller of the vehicle, according to an embodiment of the present disclosure.

FIG. 7B shows a schematic diagram 700B of interaction between a controller 716 of the system 602 receiving controlled commands and the controller 706 of the vehicle 702, according to an embodiment of the present disclosure. FIG. 7B is explained in conjunction with elements of FIG. 1A, FIG. 1B, FIG. 1C, FIG. 1D, FIG. 1E, FIG. 1F, FIG. 1G, FIG. 2A, FIG. 2B, FIG. 3A FIG. 3B, FIG. 3C, FIG. 3D, FIG. 3E, FIG. 3F, FIG. 3G, FIG. 4A, FIG. 4B, FIG. 4C, FIG. 4D, FIG. 5, FIG. 6 and FIG. 7A.

The schematic diagram 700B depicts the interaction between the controller 716 receiving controlled commands from the system 602 and the controller 706 of the vehicle 702 according to some embodiments. For example, in some embodiments, the controller 706 of the vehicle 702 may include a steering control 706A and brake/throttle controllers 706B that control rotation and acceleration of the vehicle 702. In such a case, the controller 716 outputs control inputs to the steering control 706A and the brake/throttle controllers 706B to control the state of the vehicle 702. The controller 706 may also include high-level controllers, e.g., a lane-keeping assist controller 706C that further processes the control inputs of the predictive controller 716. In both cases, the controller 706 maps use the outputs of the predictive controller 716 to control at least one actuator of the vehicle 702, such as the steering wheel and/or the brakes of the vehicle, to control the motion of the vehicle 702. States of the vehicular machine may further include position, orientation, and longitudinal/lateral velocities, and the control inputs may include lateral/longitudinal acceleration, steering angles, and engine/brake torques. The state constraints on the system may include lane-keeping constraints and obstacle avoidance constraints. Control input constraints may include steering angle constraints and acceleration constraints. Collected data may include position, orientation, velocity profiles, accelerations, torques, and/or steering angles.

FIG. 8 illustrates a flow chart 800 depicting a method for tracking the state of the receiver 102A based on the iterative feedback smoothing, according to an embodiment of the present disclosure. The flow chart 800 may include steps 802, 804 and 806. Fewer or more steps may be provided. Additionally, one or more steps may be combined or split, without departure from the scope of the disclosure.

At step 802, the method may include receiving the set of measurements indicative of the motion of the receiver 102A. The set of measurements may be collected over the period of time. The set of measurements may relate to the satellite signals including the combination of the carrier phase and one or more code signals transmitted from the set of GNSS satellites 106 and sensed by the receiver 102A at different instances of time within the period of time. Details of the reception of the set of measurements are further provided, for example, in FIG. 1A.

At step 806, the method may include processing the set of measurements relating to the receiver 102A with the probabilistic smoother to estimate the state trajectory of the receiver 102A for the period of time. The set of measurements is associated with the probabilistic estimation model. The probabilistic smoother may iteratively implement the smoothing process followed by the feedback refining process for at least some parameters of the probabilistic estimation model until the termination condition is met. The smoothing process may cause to update the state trajectory indicating the set of measurements based on the at least some parameters of the probabilistic estimation model. The feedback refining process may cause to update the at least some parameters of the probabilistic estimation model to improve the metric indicative of the measurement likelihood. Details of processing of the set of measurements are further provided, for example, in FIG. 1D.

At step 808, the method may include rendering the estimated state trajectory and the updated at least some parameters over the wired or wireless communication channel. Details of rendering the estimated state trajectory and the updated at least some parameters are further provided, for example, in FIG. 1D.

The above description provides exemplary embodiments only, and is not intended to limit the scope, applicability, or configuration of the disclosure. Rather, the following description of the exemplary embodiments will provide those skilled in the art with an enabling description for implementing one or more exemplary embodiments. Contemplated are various changes that may be made in the function and arrangement of elements without departing from the spirit and scope of the subject matter disclosed as set forth in the appended claims.

Specific details are given in the following description to provide a thorough understanding of the embodiments. However, if understood by one of ordinary skill in the art, the embodiments may be practiced without these specific details. For example, systems, processes, and other elements in the subject matter disclosed may be shown as components in block diagram form in order not to obscure the embodiments in unnecessary detail. In other instances, well-known processes, structures, and techniques may be shown without unnecessary detail to avoid obscuring the embodiments. Further, like reference numbers and designations in the various drawings indicated like elements.

Also, individual embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process may be terminated when its operations are completed but may have additional steps not discussed or included in a figure. Furthermore, not all operations in any particularly described process may occur in all embodiments. A process may correspond to a method, a function, a procedure, a subroutine, a subprogram, etc. When a process corresponds to a function, the function's termination can correspond to a return of the function to the calling function or the main function.

Furthermore, embodiments of the subject matter disclosed may be implemented, at least in part, either manually or automatically. Manual or automatic implementations may be executed, or at least assisted, through the use of machines, hardware, software, firmware, middleware, microcode, hardware description languages, or any combination thereof. When implemented in software, firmware, middleware or microcode, the program code or code segments to perform the necessary tasks may be stored in a machine readable medium. A processor(s) may perform the necessary tasks.

Various methods or processes outlined herein may be coded as software that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine. Typically, the functionality of the program modules may be combined or distributed as desired in various embodiments.

Individual embodiments above are described as a process which is depicted as a flowchart, a flow diagram, a data flow diagram, a structure diagram, or a block diagram. Although a flowchart shows the operations as a sequential process, many of the operations can be performed in parallel or concurrently. In addition, the order of the operations may be re-arranged. A process may be terminated when its operations are completed but may have additional steps not discussed or included in a figure. Furthermore, not all operations in any particularly described process may occur in all embodiments. A process may correspond to a method, a function, a procedure, a subroutine, a subprogram, etc. When a process corresponds to a function, the function's termination can correspond to a return of the function to the calling function or the main function.

Furthermore, embodiments of the subject matter disclosed may be implemented, at least in part, either manually or automatically. Manual or automatic implementations may be executed, or at least assisted, through the use of machines, hardware, software, firmware, middleware, microcode, hardware description languages, or any combination thereof. When implemented in software, firmware, middleware or microcode, the program code or code segments to perform the necessary tasks may be stored in a machine readable medium. A processor(s) may perform the necessary tasks.

Many modifications and other embodiments of the disclosure set forth herein will come to mind to one skilled in the art to which the disclosure pertains having the benefit of the teachings presented in the foregoing descriptions and the associated drawings. It is to be understood that the disclosure is not to be limited to the specific embodiments disclosed and that modifications and other embodiments are intended to be included within the scope of the appended claims. Moreover, although the foregoing descriptions and the associated drawings describe example embodiments in the context of certain example combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

What is claimed is:

1. A system for tracking a state of a receiver of a global navigational satellite system (GNSS) based on iterative feedback smoothing, comprising:
    a processor; and
    a memory having instructions stored thereon that causes the processor to:
        receive a set of measurements indicative of a motion of the receiver, the set of measurements being collected over a period of time, wherein the set of measurements relate to satellite signals including a combination of a carrier phase and one or more code signals transmitted from a set of GNSS satellites and sensed by the receiver at different instances of time within the period of time;
        process the received set of measurements relating to the receiver with a probabilistic smoother to estimate a state trajectory of the receiver for the period of time, the set of measurements is associated with a probabilistic estimation model related to the receiver, wherein
            the probabilistic smoother implements the iterative feedback smoothing comprising: a smoothing process followed by a feedback refining process for at least some parameters of the probabilistic estimation model until a termination condition is met,
            the smoothing process causes to update the state trajectory indicating the set of measurements based on the at least some parameters of the probabilistic estimation model, and
            the feedback refining process causes to update the at least some parameters of the probabilistic estimation model to improve a metric indicative of a measurement likelihood; and
        render the estimated state trajectory and the updated at least some parameters over a wired or wireless communication channel.

2. The system of claim 1, wherein the feedback refining process causes to update only the at least some parameters of the probabilistic estimation model.

3. The system of claim 1, wherein the feedback refining process causes to update the at least some parameters of the probabilistic estimation model indicative of a kinematic state of the receiver.

4. The system of claim 1, wherein the feedback refining process causes to update the at least some parameters of the probabilistic estimation model relating to stochastic processes that drive random walks of one or more kinematic states of the receiver.

5. The system of claim 1, wherein the feedback refining process causes to iteratively update the at least some parameters of the probabilistic estimation model relating to stochastic processes until the termination condition is met, and further causes to estimate integer ambiguity biases of the probabilistic estimation model to produce the rendered state trajectory.

6. The system of claim 1, wherein the feedback refining process causes to update the at least some parameters of the probabilistic estimation model based on an expectation maximization (EM) method to guarantee a monotonic improvement of the updated parameters with respect to the measurement likelihood for each EM iteration, such that intermediate smoothing solutions are discarded.

7. The system of claim 1, wherein the processor is further configured to:
    construct an objective Q-function for parameter-optimization of the at least some parameters, using the smoothing process of a relaxed estimation problem, wherein the relaxed estimation problem is a biconvex function that majorizes a negative measurement log-likelihood.

8. The system of claim 7, wherein the Q-function is formed such that arguments of the Q-function are all or some of at least one of: parameters relating to maps and functions of the probabilistic estimation model.

9. The system of claim 8, wherein the Q-function is formed such that the arguments of the Q-function are a set of parameters parametrizing at least one or more of: functions and matrices defining a measurement model of the probabilistic estimation model, the inverse covariance matrices, the functions and matrices defining a prediction model of the probabilistic estimation model, construction of the probabilistic estimation model.

10. The system of claim 8, wherein the Q-function is such that the Q-function is minimized with a regularizing term to promote assumed sparsity patterns in the resulting probabilistic estimation model.

11. The system of claim 1, wherein the processor is further configured to:
    implement the probabilistic estimation model using at least one of: an embedded system, parallel processing, or an entity taking advantage of computational hardware.

12. The system of claim 1, wherein the processor is further configured to:
    perform the smoothing process using an approximate Gaussian fixed-interval smoother, wherein the Gaussian fixed-interval smoother comprises at least one of: Rauch-Tung-Striebel smoother, Fraser-Potter smoother, or factor graph optimization smoother, the smoothing process being performed using at least one of: explicit, or statistical linearization methods to resolve nonlinearities of the probabilistic estimation model.

13. The system of claim 1, wherein the probabilistic estimation model is formed for a plurality of receivers wherein an estimation problem is formed to jointly estimate state trajectories of the plurality of receivers.

14. The system of claim 13, wherein one or more biases of the probabilistic estimation model for each of the plurality of receivers are described as being identical due to a geographical proximity between the plurality of receivers.

15. The system of claim 13, wherein the plurality of receivers is mounted on vehicles, wherein the plurality of receivers is configured to determine a position of a corresponding vehicle.

16. The system of claim 13, wherein the plurality of receivers is mounted on aquatic buoys, wherein the plurality of receivers is configured to determine sporadic changes during at least one of: seismic, or irrigation events, using parameter adaptation of the probabilistic estimation model.

17. A method for tracking a state of a receiver of a global navigational satellite system (GNSS) based on iterative feedback smoothing, comprising:
  receiving a set of measurements indicative of a motion of the receiver, the set of measurements being collected over a period of time wherein the set of measurements relate to satellite signals including a combination of a carrier phase and one or more code signals transmitted from a set of GNSS satellites and sensed by the receiver at different instances of time within the period of time;
  processing the received set of measurements relating to the receiver with a probabilistic smoother to estimate a state trajectory of the receiver for the period of time, the set of measurements is associated with a probabilistic estimation model related to the receiver, wherein processing the set of measurements comprises:
    implementing the iterative feedback smoothing comprising: a smoothing process followed by a feedback refining process by the probabilistic smoother, for at least some parameters of the probabilistic estimation model until a termination condition is met,
    the smoothing process comprises updating the state trajectory indicating the set of measurements based on the at least some parameters of the probabilistic estimation model, and
    the feedback refining process comprises updating the at least some parameters of the probabilistic estimation model to improve a metric indicative of a measurement likelihood; and
  rendering the estimated state trajectory and the updated at least some parameters over a wired or wireless communication channel.

18. The method of claim 17, wherein the feedback refining process comprises updating only the at least some parameters of the probabilistic estimation model.

19. The method of claim 17, wherein the feedback refining process comprises updating the at least some parameters of the probabilistic estimation model indicative of a kinematic state of the receiver.

20. A non-transitory computer readable storage medium embodied thereon a program executable by a processor for performing a method for tracking a state of a receiver of a global navigational satellite system (GNSS) based on iterative feedback smoothing, the method comprising:
  receiving a set of measurements indicative of a motion of the receiver, the set of measurements being collected over a period of time wherein the set of measurements relate to satellite signals including a combination of a carrier phase and one or more code signals transmitted from a set of GNSS satellites and sensed by the receiver at different instances of time within the period of time;
  processing the received set of measurements relating to the receiver with a probabilistic smoother to estimate a state trajectory of the receiver for the period of time, the set of measurements is associated with a probabilistic estimation model related to the receiver, wherein processing the set of measurements comprises:
    implementing the iterative feedback smoothing comprising: a smoothing process followed by a feedback refining process by the probabilistic smoother, for at least some parameters of the probabilistic estimation model until a termination condition is met,
    the smoothing process comprises updating the state trajectory indicating the set of measurements based on the at least some parameters of the probabilistic estimation model, and
    the feedback refining process comprises updating the at least some parameters of the probabilistic estimation model to improve a metric indicative of a measurement likelihood; and
  rendering the estimated state trajectory and the updated at least some parameters over a wired or wireless communication channel.

* * * * *